(12) United States Patent
Searles et al.

(10) Patent No.: US 7,983,362 B2
(45) Date of Patent: Jul. 19, 2011

(54) PROGRAMMABLE DATA SAMPLING RECEIVER FOR DIGITAL DATA SIGNALS

(75) Inventors: Shawn Searles, Austin, TX (US); Grace Chuang, Austin, TX (US); Christopher M. Kurker, Austin, TX (US); Curtis M. Brody, Austin, TX (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 690 days.

(21) Appl. No.: 12/100,996

(22) Filed: Apr. 10, 2008

(65) Prior Publication Data

US 2009/0259872 A1 Oct. 15, 2009

(51) Int. Cl.
*H04L 27/00* (2006.01)

(52) U.S. Cl. ............ 375/326; 327/52; 327/89; 327/96; 327/127; 327/246; 330/250; 330/252; 375/318; 713/401

(58) Field of Classification Search .................. None
See application file for complete search history.

(56) References Cited

U.S. PATENT DOCUMENTS

| | | | |
|---|---|---|---|
| 6,002,275 A | 12/1999 | Hosokawa et al. | |
| 6,134,153 A | 10/2000 | Lines et al. | |
| 6,317,369 B1 * | 11/2001 | Kubo et al. | 365/193 |
| 6,429,700 B1 * | 8/2002 | Yang | 327/108 |
| 6,597,217 B2 * | 7/2003 | Ingino, Jr. | 327/157 |
| 6,600,346 B1 * | 7/2003 | Macaluso | 327/108 |
| 6,757,347 B1 | 6/2004 | Lo et al. | |
| 7,109,770 B1 | 9/2006 | Bui | |
| 7,180,352 B2 | 2/2007 | Mooney et al. | |
| 7,256,652 B1 | 8/2007 | Fang et al. | |
| 2005/0035820 A1 | 2/2005 | Pessl | |

OTHER PUBLICATIONS

Jedec Standard, "DDR2 SDRAM Specification", JESD79-2C (Revision of JESD79-2B) Jedec Solid State Technology Association, May 2006.

* cited by examiner

*Primary Examiner* — Dac Ha
*Assistant Examiner* — Adolf Dsouza
(74) *Attorney, Agent, or Firm* — Ingrassia Fisher & Lorenz, P.C.

(57) ABSTRACT

Receiver architectures and bias circuits for a data processor are provided. A receiver architecture includes a linear receiver having a first input node for a data (DQ) signal, a second input node for a reference voltage, and output nodes for a differential output signal. The linear receiver compares the DQ signal to the reference voltage, and generates the differential output signal in response to the comparison. A sense amplifier is coupled to the linear receiver. The sense amplifier has input nodes connected to the output nodes of the linear receiver, and an output node for a binary output signal having voltage characteristics compatible with the processor. The sense amplifier transforms the differential output signal into the binary output signal. The receiver architecture also includes a programming architecture coupled to the linear receiver to set operating characteristics of the linear receiver.

19 Claims, 12 Drawing Sheets

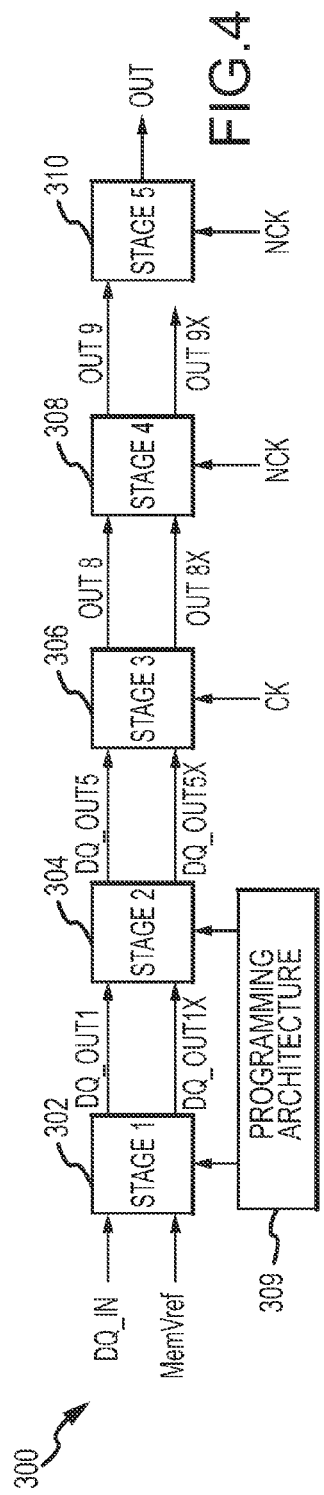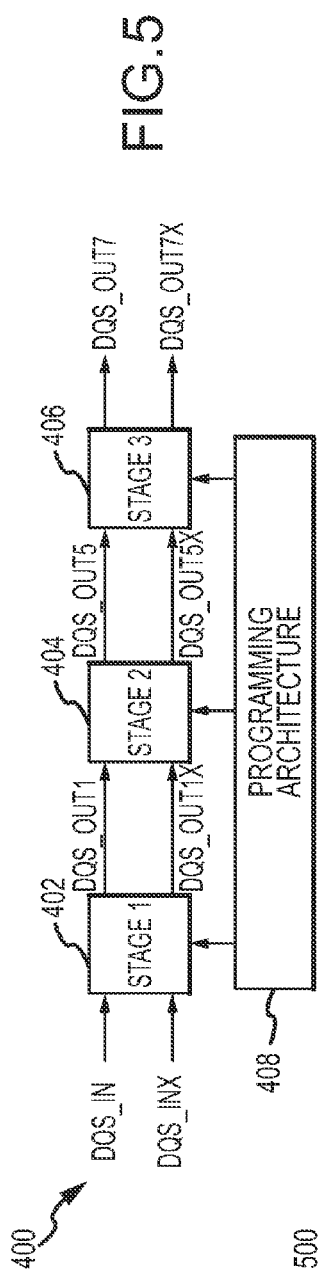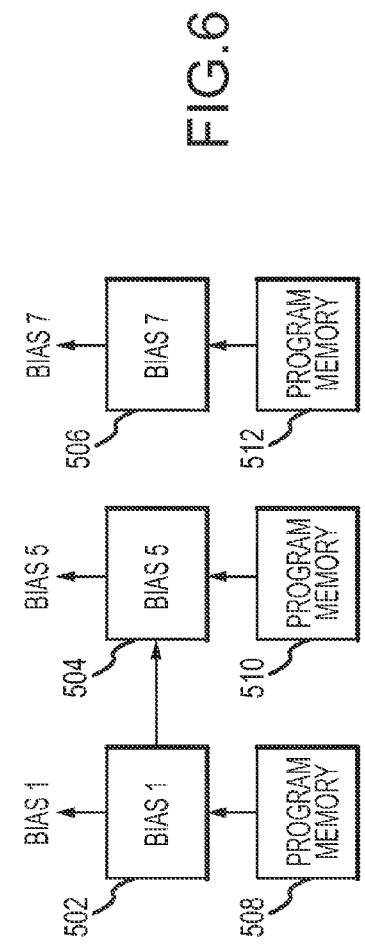

PROGRAMMABLE DATA SAMPLING RECEIVER FOR DIGITAL DATA SIGNALS

CROSS-REFERENCE TO RELATED APPLICATION(S)

The subject matter disclosed herein is related to that disclosed in U.S. patent application Ser. No. 12/100,979, corresponding to U.S. Pat. No. 7,652,937, and U.S. patent application Ser. No. 12/100,999 corresponding to U.S. Pat. No. 7,826,279.

TECHNICAL FIELD

Embodiments of the subject matter described herein relate generally to electronic and computing systems. More particularly, embodiments of the subject matter relate to data and clock receiver circuits of the type found in computer processors.

BACKGROUND

Computer systems and other electronic systems rely on the communication of digital data. Synchronous Dynamic Random Access Memory (SDRAM) devices are commonly used in computer systems, and such SDRAM devices cooperate with processor devices to support data read and write operations. The JEDEC Solid State Technology Association publishes specifications related to double data rate (DDR) SDRAM devices. The existing DDR specifications are the DDR2 and DDR3 specifications. According to DDR2/DDR3, the SDRAM memory cells transfer data on both rising and falling clock edges. DDR2 devices support 4-bit or 8-bit output burst modes, while DDR3 devices support an 8-bit output burst mode.

In a read operation, a DDR2/DDR3 device generates a clock/strobe signal (referred to as DQS) and data signals (referred to as DQ). Each byte includes eight single-ended DQ signals and one or two differential DQS signals. In one operating mode, one differential DQS signal is used to clock the eight DQ signals in a byte. In another operating mode, one differential DQS signal is used to clock four DQ signals in a byte, while a second differential DQS signal is used to clock the other four DQ signals in the byte. Ideally, the memory device outputs the DQ and DQS signals for a given byte in a time-aligned (e.g., edge-aligned) manner. However, the edges may no longer be aligned by the time the DQ and DQS signals reach the processor. In other words, the DQ signals will typically be skewed relative to one another when they arrive at the processor. Excessive skew in the DQ signals can make it difficult to clock all of them using one DQS signal because of an increased likelihood of sampling a DQ signal while it is transitioning between valid states, and excessive skew limits the maximum DDR operating speed.

BRIEF SUMMARY

The above and other aspects may be carried out by an embodiment of a receiver architecture for a computer processor. The receiver architecture includes a linear receiver portion having a first input node for a data (DQ) signal, a second input node for a reference voltage, and output nodes for a differential output signal, the linear receiver portion being configured to compare the DQ signal to the reference voltage, and to generate the differential output signal in response to the comparison. A sense amplifier portion is coupled to the linear receiver portion, the sense amplifier portion having input nodes connected to the output nodes of the linear receiver portion, and an output node for a binary output signal having voltage characteristics compatible with the computer processor, the sense amplifier portion being configured to transform the differential output signal into the binary output signal. A programming architecture is coupled to the linear receiver portion, the programming architecture being configured to set operating characteristics of the linear receiver portion.

Another embodiment of a receiver architecture for a computer processor includes a first programmable linear receiver stage configured to receive a single-ended DQ signal and a reference voltage, and to generate a first differential output signal in response to a comparison between the DQ signal and the reference voltage, where the first differential output signal swings between an upper supply voltage and a voltage corresponding to the upper supply voltage minus a programmable swing voltage. The receiver architecture also includes a second programmable linear receiver stage coupled to the first programmable linear receiver stage, the second programmable linear receiver stage being configured to receive the first differential output signal, and to generate a second differential output signal by shifting the first differential output signal by a programmable shift voltage. A first sampling amplifier stage is coupled to the second programmable linear receiver stage, the first sampling amplifier stage being configured to receive the second differential output signal, and to generate a first sampled output signal and a second sampled output signal in response to the second differential output signal and in response to a non-inverted clock signal. A second sampling amplifier stage is coupled to the first sampling amplifier stage, the second sampling amplifier stage being configured to receive the first sampled output signal and the second sampled output signal, and to generate a binary output signal in response to the first sampled output signal, the second sampled output signal, and an inverted clock signal. In addition, a pulse stretching stage is coupled to the second sampling amplifier stage, the pulse stretching stage being configured to transform the binary output signal into a digital output signal that conveys valid data throughout entire cycles of the clock signal, wherein the digital output signal has voltage swing and voltage level characteristics compatible with the computer processor. The receiver architecture also employs a programming architecture coupled to the first programmable linear receiver stage and to the second programmable linear receiver stage, the programming architecture being configured to set the programmable swing voltage and the programmable shift voltage.

An embodiment of a receiver architecture for a computer processor is also provided. The receiver architecture includes a plurality of DQ receivers, each being configured to receive a respective DQ signal and a reference voltage as inputs, and each being configured to transform its DQ signal into a corresponding binary output signal based upon a comparison between the DQ signal and the reference voltage. The receiver architecture also includes a DQS receiver coupled to each of the DQ receivers, the DQS receiver being configured to receive a shared differential DQS input signal for the DQ receivers, and to generate a differential DQS output signal in response to the differential DQS input signal. In addition, the receiver architecture includes a programming architecture coupled to the DQ receivers and to the DQS receiver, the programming architecture being configured to set operating characteristics of the DQ receivers and the DQS receiver. Clock signals used by the DQ receivers are derived from the differential DQS output signal, and each of the DQ receivers comprises a programmable linear receiver portion configured to receive its respective DQ signal and the reference voltage, and a clocked sense amplifier portion directly connected to the programmable linear receiver portion. Moreover, operation of each programmable linear receiver portion is influenced by the programming architecture such that the binary output signal is generated with voltage swing and voltage level characteristics compatible with the computer processor.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 4 is a high level block diagram of an embodiment of a DQ receiver suitable for use with a processor of a computer system;

FIG. 5 is a high level block diagram of an embodiment of a DQS receiver suitable for use with a processor of a computer system;

FIG. 6 is a high level block diagram of an embodiment of a programming architecture suitable for use with the DQ receiver shown in FIG. 4 and the DQS receiver shown in FIG. 5;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although an illustrated circuit schematic might depict one exemplary arrangement of elements, additional intervening elements, devices, features, or components may be present in an embodiment of the depicted subject matter.

When used herein in the context of a label or descriptor for a signal or a voltage level, the letter "X" indicates the negative or inverse of a counterpart signal or voltage level. For example, a signal labeled ABCX, ABCx, or $ABC_X$ represents the inverted component of a signal labeled ABC. Likewise, a differential signal can be identified using the combination of two complementary signals, such as ABC and ABCX.

For the sake of brevity, conventional aspects of DRAM devices, computer processor architectures, transistor-based electronic circuits, data/clock receivers, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Figure 1:
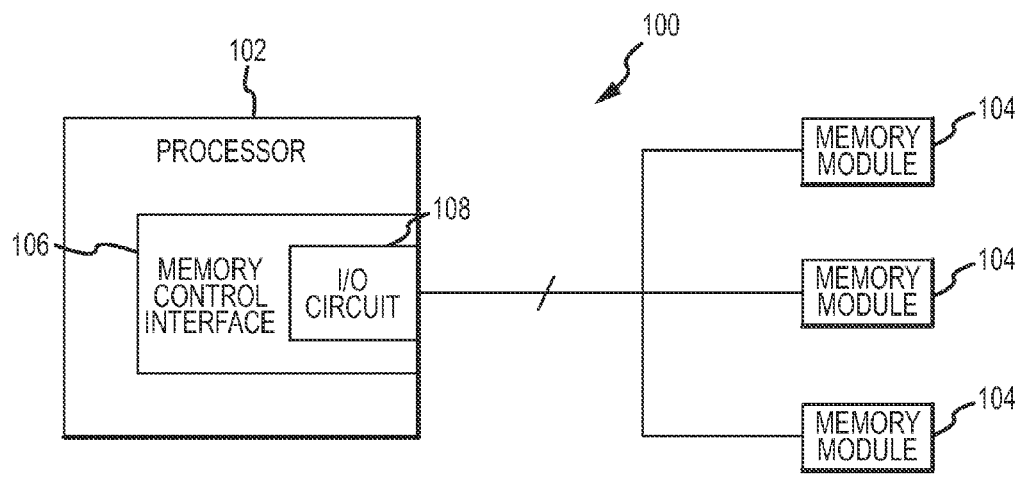
FIG. 1 is a schematic representation of one embodiment of a computer system that incorporates the receiver technologies described herein.

FIG. 1 is a schematic representation of one embodiment of a computer system 100 that incorporates the receiver technologies described herein. It should be noted that the embodiment of computer system 100 shown in FIG. 1 is exemplary, and that the receiver circuits discussed herein may be implemented in a wide variety of electronic systems other than any particular computing platform or architecture discussed here. In the embodiment shown, computer system 100 includes a processor 102, which is coupled to a plurality of memory modules 104. More particularly, processor 102 includes a memory control interface 106, which in turn includes an input/output (I/O) circuit 108. Although FIG. 1 depicts I/O circuit 108 as being implemented within processor 102, other embodiments may utilize an I/O circuit (or portions thereof) that resides outside of the processor core, or possibly on a different circuit chip.

The embodiment of I/O circuit 108 implemented in memory control interface 106 may utilize the linear receiver and sampling receiver circuits described in more detail below for receiving clock signals and data signals, respectively, from memory modules 104. In practice, I/O circuit 108 receives clock and data signals generated by memory modules 104, and processes the data signals into voltage levels that represent ones and zeros in the domain of processor 102.

Thus, memory control interface 106 is coupled to receive signals from memory modules 104 via I/O circuit 108. Although not the subject of this description, I/O circuit 108 may also be suitably configured with transmitter circuits to support data writing operations.

In certain embodiments, memory modules 104 may be implemented and packaged as dual inline memory modules (DIMMs). The memory modules 104 and memory control interface 106 may conform to various specifications, such as the DDR2 SDRAM Specification and/or the DDR3 SDRAM Specification (published by JEDEC Solid State Technology Association). The exemplary embodiments described herein are designed for compatibility with the existing DDR2/DDR3 protocols and electrical requirements. It should be appreciated that the techniques, concepts, and technologies described herein need not be limited to DDR2/DDR3 applications. These techniques, concepts, and technologies can be modified and varied as needed for compatibility with other memory device protocols and electrical requirements.

Figure 2:
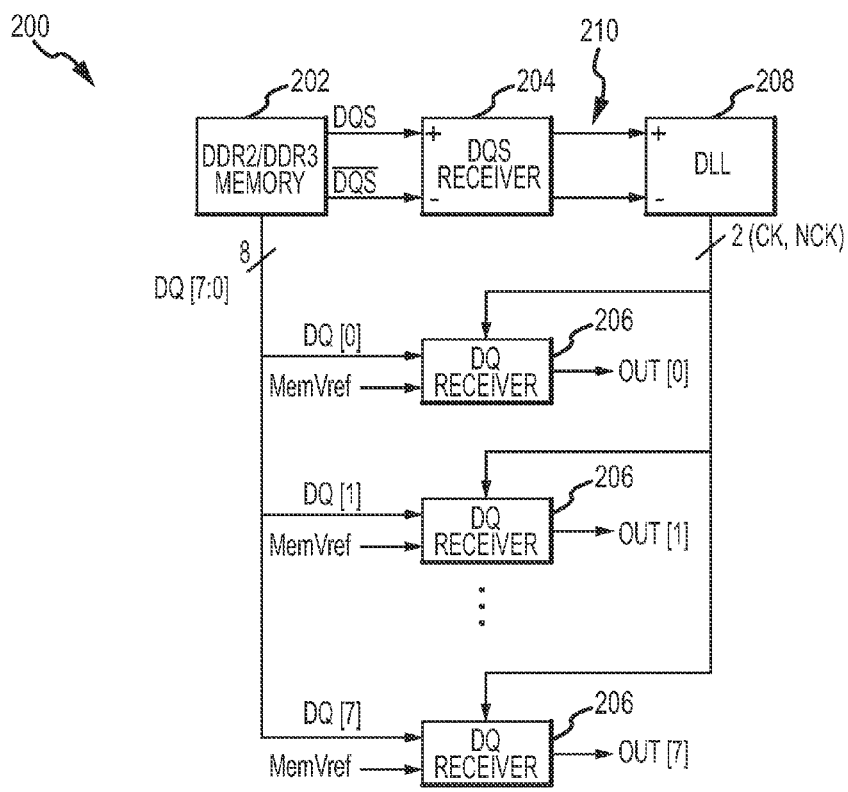
FIG. 2 is a schematic representation of an arrangement of DQS and DQ receivers suitable for use with a computer system.
Figure 3:
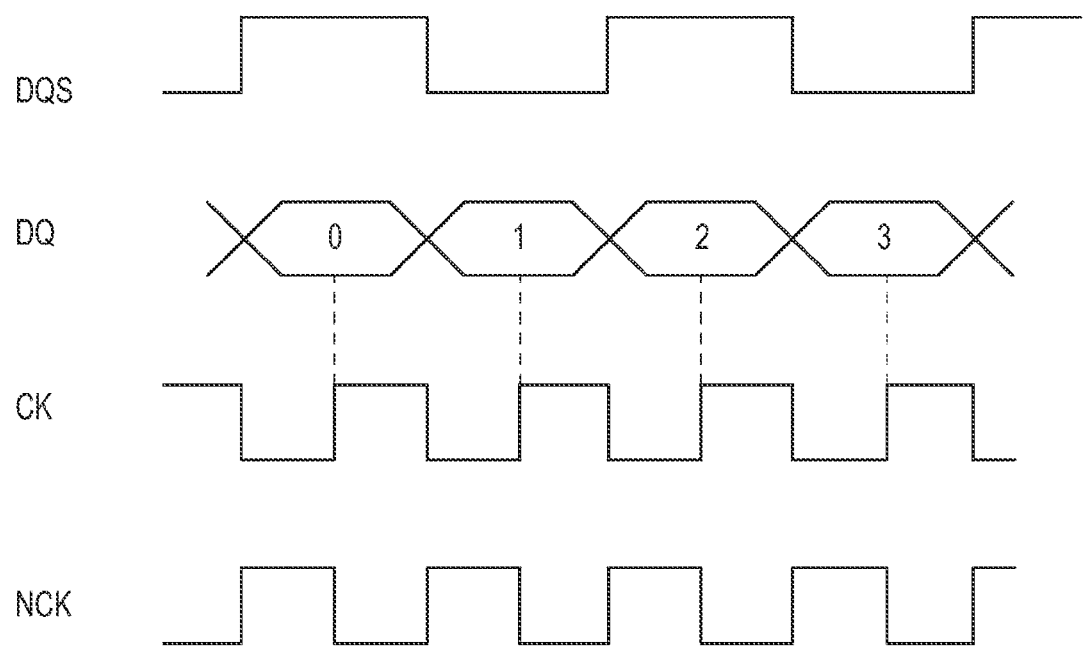
FIG. 3 is a diagram that depicts an ideal waveform without skew associated with the operation of the arrangement shown in FIG. 2.

FIG. 2 is a schematic representation of an arrangement 200 of clock and data receivers suitable for use with a computer system such as computer system 100, and FIG. 3 is a diagram that depicts signals associated with the operation of the arrangement 200. This particular example includes a DDR2/DDR3 (either type will suffice) memory element 202 that is coupled to a DQS receiver 204 and a plurality of DQ receivers 206. This arrangement 200 also includes a delay locked loop (DLL) 208 coupled to DQS receiver 204 and to DQ receivers 206. Arrangement 200 depicts a practical embodiment where memory element 202 outputs eight bits of data (in the form of eight single-ended DQ signals) concurrently with one differential clock/strobe signal (in the form of a non-inverted DQS signal and a corresponding inverted DQS signal). Accordingly, arrangement 200 has eight DQ receivers 206—one for each bit of the byte—and one DQS receiver 204. A processor in a computer system may have any number of DQS and DQ receivers, depending upon its particular configuration. For example, one embodiment of a processor may utilize 64 DQ receivers per channel (eight bytes per channel; eight bits per byte), and two channels, for a total of 128 DQ receivers. Of course, an embodiment may be suitably configured to support any number of bits per byte, any number of bytes, and any number of channels per processor.

In operation, DQS receiver 204 receives the differential DQS signal (which conveys a binary clock signal having a low voltage level and a high voltage level) from memory element 202 and generates a binary differential output 210 having voltage levels that are compatible with DLL 208. DLL 208 receives the differential output 210 from DQS receiver 204, and generates therefrom a clock (CK) signal and a negative clock (NCK) signal by doubling the frequency of differential output 210 and adding delay. As mentioned previously, memory element 202 concurrently generates the differential DQS signal and eight DQ signals. As depicted in FIG. 2, each DQ signal serves as an input to its respective DQ receiver 206, and the CK and NCK signals are used by DQ receivers 206 to process their respective DQ signals. Ideally, the output of a DQ receiver 206 will be a voltage corresponding to a logic high (i.e., a one) if the input DQ signal is greater than a reference voltage (MemVref) by any amount, and a voltage corresponding to a logic low (i.e., a zero) otherwise.

FIG. 3 illustrates an ideal scenario where the bits conveyed by the DQ signal are edge-aligned with the DQS signal. In practice, the memory device originates the differential DQS signal and the DQ signals in a substantially edge-aligned manner, although such edge-alignment may be somewhat skewed when the signals are actually received at the processor. For simplicity, the inverse of the DQS signal is not shown in FIG. 3. Notably, for DDR2/DDR3, the DQ signal transitions at both the rising edge and the falling edge of the DQS signal. The DLL 208 generates the CK and NCK signals such that the rising edge of the CK signal (and, conversely, the falling edge of the NCK signal) is aligned near the center of the eye defined by the DQ signal. FIG. 3 illustrates this timing alignment. In other words, the DLL 208 aligns the CK and NCK signals to facilitate sampling of the DQ signal (and/or sampling of differential signals generated during the processing of the DQ signal) at a well-defined and settled time, rather than near one of the two transition points. As mentioned above, the timing of the CK and NCK signals is important for practical embodiments where multiple DQ signals (for example, eight) are clocked by a common DQS signal. Thus, a transition edge of the CK/NCK signal preferably occurs at a sampling time when all of the DQ signals are well-settled. This enables maximizing of DDR speed. At low speeds, the placement of the DQS signal is relatively flexible since the sampling eye is wider. However, at higher speeds the sampling eye is narrower and finding the optimal CK/NCK edges can be a major factor in determining the DDR speed.

FIG. 4 is a high level block diagram of an embodiment of a DQ receiver 300 suitable for use with a processor of a computer system. DQ receiver 300 is preferably implemented as an integrated circuit that is manufactured using an appropriate semiconductor fabrication process, such as a 65 nanometer silicon-on-insulator (SOI) process. Each of the DQ receivers implemented in an I/O circuit of a computer processor can be configured in this manner.

DQ receiver 300 receives as inputs a respective single-ended data input signal (labeled DQ_IN) and a reference voltage (labeled MemVref), and generates an output signal in response to DQ_IN. In practice, the DQ_IN signal represents a signal obtained from a memory element, e.g., a DDR2 or DDR3 memory device, where that signal conveys binary information (i.e., logic high and logic low voltage levels). In preferred embodiments the MemVref voltage is common among all of the DQ receivers employed by the processor. Notably, DQ_IN and MemVref can be of any voltage ranging from VSS to VDDIO (as defined in the applicable DDR specification), including voltages that exceed the stated oxide breakdown threshold of the transistors utilized to implement DQ receiver 300. As described in more detail below, DQ receiver 300 is suitably configured and programmed to provide overvoltage protection for the transistors by scaling its operating voltage characteristics such that the oxide breakdown threshold is not actually exceeded.

The output signal of DQ receiver 300 is generated in a voltage domain that is appropriate for the processor, and with the desired voltage swing between logic high and logic low levels. In practice, DQ receiver 300 needs to be able to detect and resolve voltage swings that may not be as large as that generated by the memory elements. The received signals may also be corrupted in time, have distorted wave shapes, or the like, and DQ receiver 300 is preferably configured to handle such inconsistencies.

DQ receiver 300 is preferably configured as a multistage transistor-based circuit. This particular embodiment includes five stages, although more or less may be possible in different embodiments. Each of the stages is described in more detail below with reference to exemplary transistor-based circuit implementations. DQ receiver 300 includes a linear receiver portion and a clocked sense amplifier portion that is directly connected to the linear receiver portion. In FIG. 4, the linear receiver portion includes a first stage 302 combined with a second stage 304, and the clocked sense amplifier portion includes a third stage 306 combined with a fourth stage 308.

Notably, DQ receiver 300 includes programmable operating characteristics and features that allow it to flexibly accommodate manufacturing process variations. Such programmability is desirable such that the circuitry of DQ receiver 300 need not be redesigned in response to variations, developments, or changes in the particular semiconductor fabrication process. In FIG. 4, DQ receiver 300 is generally depicted with a programming architecture 309, which is suitably configured to program, control, or otherwise influence the operation of DQ receiver 300. In a practical implementation, programming architecture 309 may include or cooperate with, without limitation: one or more bias circuits; one or more memory elements; a computer-executable software program, e.g., a BIOS of the host computing platform; or the like. Moreover, although programming architecture 309 is depicted as a single functional component in FIG. 4, it may actually be realized using any number of elements, circuits, functional modules, etc. For the particular embodiment shown in FIG. 4, first stage 302 and second stage 304 are programmable elements that can be controlled in response to settings established by programming architecture 309. The programmable nature of first stage 302 and second stage 304 will be described in more detail below.

The first stage 302 has an input node for receiving DQ_IN, and an input node for receiving the reference voltage (MemVref). First stage 302 includes output nodes for a differential output signal that is generated in response to a comparison of DQ_IN to MemVref. In this regard, if DQ_IN is greater than MemVref, then the non-inverted output (labeled DQ_OUT1) will be set at a designated high output voltage and the inverted output (labeled DQ_OUT1X) will be set at the designated high output voltage minus a designated swing voltage, which is programmable via programming architecture 309. On the other hand, if DQ_IN is not greater than MemVref, then DQ_OUT1X will be at the designated high output voltage and DQ_OUT1 will be at the designated high output voltage minus the designated swing voltage. Conceptually, DQ_OUT1 "tracks" DQ_IN in that it is relatively high when DQ_IN is high, and it is relatively low when DQ_IN is low.

The second stage 304 of DQ receiver 300 is coupled to first stage 302. Second stage 304 receives DQ_OUT1 and DQ_OUT1X as inputs. Second stage 304 has a pair of level shifters that reduces the voltage of DQ_OUT1 and DQ_OUT1X by a predetermined shift voltage, which is programmable via programming architecture 309. Thus, second stage 304 generates a differential output (labeled DQ_OUT5 and DQ_OUT5X), where:

$$DQ\_OUT5=DQ\_OUT1-V_{SHIFT\_DQ}; \text{ and}$$

$$DQ\_OUT5X=DQ\_OUT1X-V_{SHIFT\_DQ},$$

The value of $V_{SHIFT\_DQ}$ is selected to make DQ_OUT5 and DQ_OUT5X compatible with the subsequent stages of DQ receiver 300.

A third stage 306 and a fourth stage 308 of DQ receiver 300 function as a sense amplifier that converts a relatively small swing dual rail signal into a usable digital signal that has voltage levels compatible with the processor. Third stage 306 has input nodes that are coupled to the output nodes of second stage 304 of DQ receiver 300. Third stage 306 uses DQ_OUT5 and DQ_OUT5X as inputs, and generates two binary output signals (labeled OUT8 and OUT8X) in response thereto. As depicted in FIG. 4, third stage 306 is sampled by CK. Fourth stage 308, which is coupled to third stage 306, uses OUT8 and OUT8X as inputs, and generates two binary output signals (labeled OUT9 and OUT9X) in response thereto. As explained in more detail below, OUT9 represents a binary output signal having voltage characteristics (e.g., voltage swing and voltage level) that are compatible with the computer processor. Fourth stage 308 is sampled by NCK, which is the inverse of the CK signal. The embodiment shown in FIG. 2 generates the CK and NCK signals with DLL 208.

Third stage 306 and fourth stage 308 cooperate to transform the differential signal (DQ_OUT5 and DQ_OUT5X) into the binary output signal labeled OUT9. In turn, a fifth stage 310 of DQ receiver 300 is coupled to fourth stage 308. As shown in FIG. 5, fifth stage 310 operates in response to the NCK signal. Fifth stage 310 is suitably configured to function as a "zero catcher" or a "pulse stretcher" that receives OUT9 as an input, and transforms OUT9 into a respective digital output signal (labeled OUT) that conveys valid data throughout entire clock cycles of DQ receiver 300 (i.e., cycles of CK and/or NCK). Fifth stage 310 may be necessary in practical implementations where OUT9 is valid only for half of a clock cycle. The OUT signal conveys bits using the voltage levels and voltage swing utilized by the processor. Note that the OUT9X signal need not be utilized by DQ receiver 300. In practice, OUT9X may serve as an input to a load matching circuit, element, or stage (not shown) for purposes of balancing the output of fourth stage 308.

FIG. 5 is a high level block diagram of an embodiment of a DQS receiver 400 suitable for use with a processor of a computer system. DQS receiver 400 is preferably implemented as an integrated circuit that is manufactured using an appropriate semiconductor fabrication process, such as a 65 nanometer SOI oxide process. Moreover, DQS receiver 400 can be integrally fabricated with DQ receivers 300, and DQS receiver 400 and DQ receivers 300 can be used together in one DDR interface. Each of the DQS receivers implemented in an I/O circuit of a computer processor can be configured in the manner depicted in FIG. 5.

DQS receiver 400 receives a differential clock/strobe signal (labeled DQS_IN and DQS_INX) as an input, and generates a differential output signal (labeled DQS_OUT7 and DQS_OUT7X) in response thereto. In practice, the DQS_IN and DQS_INX signals are obtained from a memory element, e.g., a DDR2 or DDR3 memory device, and the DQS_IN and DQS_INX signals are associated with a plurality of DQ signals obtained from the same memory element. Moreover, DQS_OUT7 and DQS_OUT7X are generated in a voltage domain that is appropriate for the DLL (see FIG. 2) that produces the CK and NCK signals utilized by DQ receiver 300. Notably, DQS_IN and DQS_INX can be of any voltage ranging from VSS to VDDIO (as defined in the applicable DDR specification), including voltages that exceed the stated oxide breakdown threshold of the transistors utilized to implement DQS receiver 400. As described in more detail below, DQS receiver 400 is suitably configured and programmed to provide overvoltage protection for the transistors by scaling its operating voltage characteristics such that the oxide breakdown threshold is not actually exceeded.

DQS receiver 400 is preferably configured as a multistage transistor-based circuit. This particular embodiment includes three stages (a first linear receiver stage 402, a second linear receiver stage 404, and a third linear receiver stage 406), although more or less may be possible in different embodiments. Each of the stages is described in more detail below with reference to exemplary transistor-based circuit implementations.

Notably, DQS receiver 400 includes programmable operating characteristics and features that allow it to flexibly accommodate manufacturing process variations. Such programmability is desirable such that the circuitry of DQS receiver 400 need not be redesigned in response to variations, developments, or changes in the particular semiconductor fabrication process. In FIG. 5, DQ receiver 400 is generally depicted with a programming architecture 408, which is suitably configured to program, control, or otherwise influence the operation of DQS receiver 400. In a practical implementation, programming architecture 408 may include or cooperate with, without limitation: one or more bias circuits; one or more memory elements; a computer-executable software program, e.g., a BIOS of the host computing platform; or the like. In this regard, programming architecture 408 may be combined with programming architecture 309 (FIG. 4) in various embodiments. Moreover, although programming architecture 408 is depicted as a single functional component in FIG. 5, it may actually be realized using any number of elements, circuits, functional modules, etc. For the particular embodiment shown in FIG. 5, first linear receiver stage 402, second linear receiver stage 404, and third linear receiver stage 406 are programmable elements that can be controlled in response to settings established by programming architecture 408. The programmable nature of these stages will be described in more detail below.

The first linear receiver stage 402 is configured to receive DQS_IN and DQS_INX as inputs, and first linear receiver stage 402 transforms DQS_IN and DQS_INX into a differential output signal (labeled DQS_OUT1 and DQS_OUT1X) that corresponds to a version of the differential DQS input having a desired voltage swing, which is programmable via programming architecture 408. The second linear receiver stage 404 of DQS receiver 400 is coupled to first linear receiver stage 402. Second linear receiver stage 404 receives DQS_OUT1 and DQS_OUT1X as inputs, and second linear receiver stage 404 functions as a level shifter that reduces the voltage of DQS_OUT1 and DQS_OUT1X by a predetermined shift voltage, which is programmable via programming architecture 408. Thus, second linear receiver stage 404 generates a differential output (labeled DQS_OUT5 and DQS_OUT5X), where:

$$DQS\_OUT5 = DQS\_OUT1 - V_{SHIFT\_DQS}; \text{ and}$$

$$DQS\_OUT5X = DQS\_OUT1X - V_{SHIFT\_DQS},$$

In certain embodiments, the circuit topology of second linear receiver stage 404 is identical to the circuit topology of second stage 304 of DQ receiver 300 (as described in more detail below). Moreover, for this particular implementation, $V_{SHIFT\_DQS}$ equals $V_{SHIFT\_DQ}$, which is associated with the operation of DQ receiver 300.

The third linear receiver stage 406 of DQS receiver 400 is coupled to second linear receiver stage 404. Third linear receiver stage 406 receives DQS_OUT5 and DQS_OUT5X as inputs. Third linear receiver stage 406 is a differential amplifier that transforms DQS_OUT5 and DQS_OUT5X into a differential output signal (labeled DQS_OUT7 and DQS_OUT7X) having appropriate voltage levels and a designated voltage swing that are compatible with the DLL of the processor (see FIG. 2). The voltage swing of third linear receiver stage 406 is also programmable via programming architecture 408. As mentioned above, the clock signals used by the clocked sense amplifier portion of the DQ receivers are derived from DQS_OUT7 and DQS_OUT7X, with two times frequency multiplication.

FIG. 6 is a high level block diagram of an embodiment of a programming architecture 500 suitable for use with DQ receiver 300 and DQS receiver 400. FIG. 6 depicts a simplified high level arrangement of a bias circuit 502, a bias circuit 504, a bias circuit 506, a program memory element 508 for bias circuit 502, a program memory element 510 for bias circuit 504, and a program memory element 512 for bias circuit 506. Each of these bias circuits is described in more detail below with reference to exemplary transistor-based circuit implementations. Bias circuit 502 is suitably configured to generate a bias voltage (labeled BIAS1) voltage used by first stage 302 of DQ receiver 300 and first linear receiver stage 402 of DQS receiver 400. Bias circuit 504 is suitably configured to a bias voltage (labeled BIAS5) used by second stage 304 of DQ receiver 300 and second linear receiver stage 404 of DQS receiver 400. In certain embodiments, bias circuit 504 is coupled to bias circuit 502 such that bias circuit 504 can receive one or more inputs from bias circuit 502. Bias circuit 506 is suitably configured to generate a bias voltage (labeled BIAS7) used by third linear receiver stage 406 of DQS receiver 400.

As described in more detail below, the bias circuits are programmable to accommodate different PVT (manufacturing Process, supply Voltage, and operating Temperature) combinations and conditions. In addition, the bias circuits are operable to set the various swing voltages and shift voltages described here with reference to the DQ and DQS receivers. In certain embodiments, program memory elements 508/510/512 are suitably configured to store instructions, binary codes, register values, settings, or other information that is utilized to program the bias circuits. Although each program memory element is depicted as a separate functional component in FIG. 6, any two or all of the program memory elements can be combined. In preferred embodiments, each of the program memory elements 508/510/512 includes or cooperates with a one or more registers associated with the basic input/output system (BIOS) of the processor, and the BIOS can be rewritten as needed to update the program settings of bias circuit 502, bias circuit 504, and/or bias circuit 506.

Figure 7:
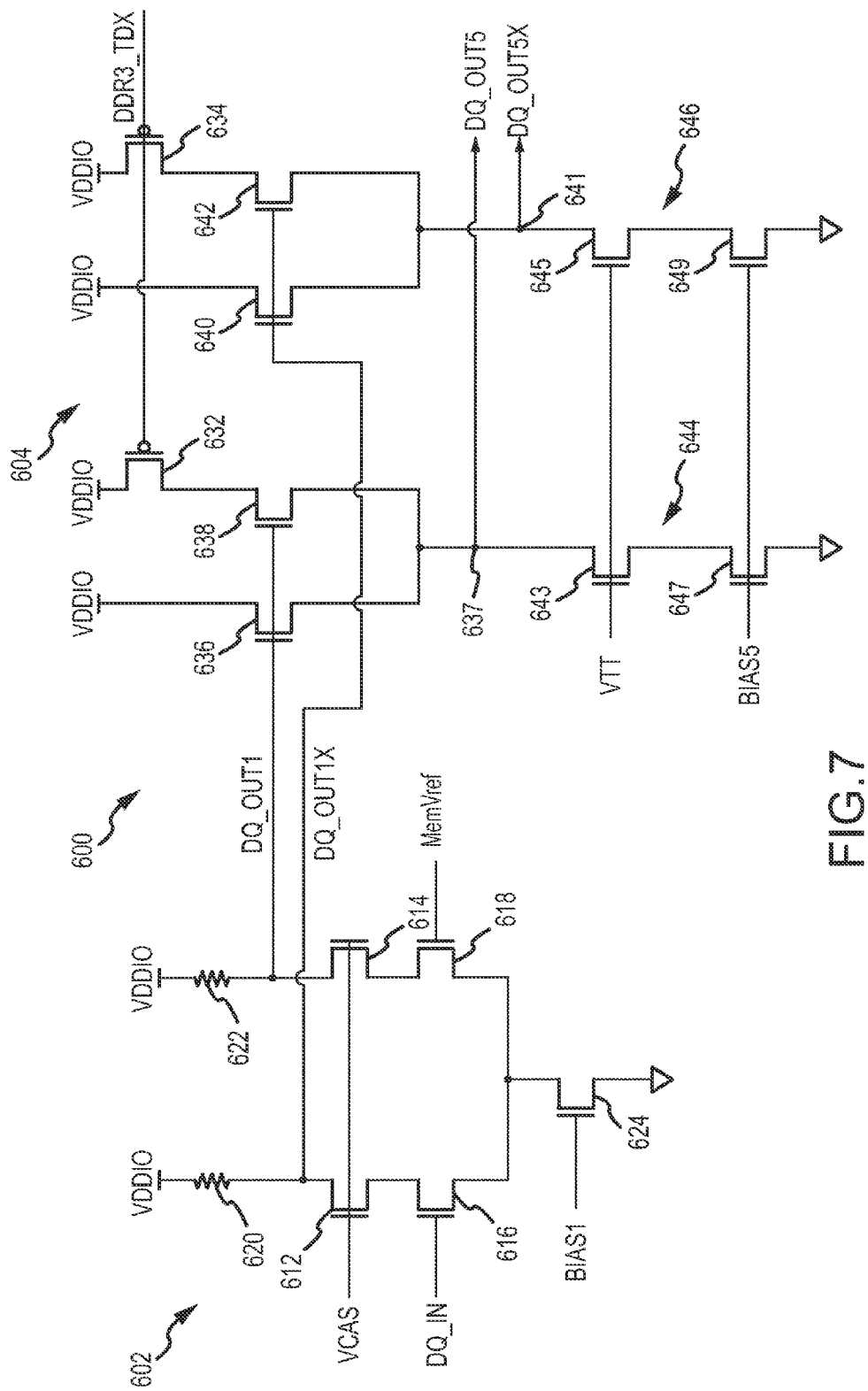
FIG. 7 is a circuit schematic of the first two stages.
Figure 8:
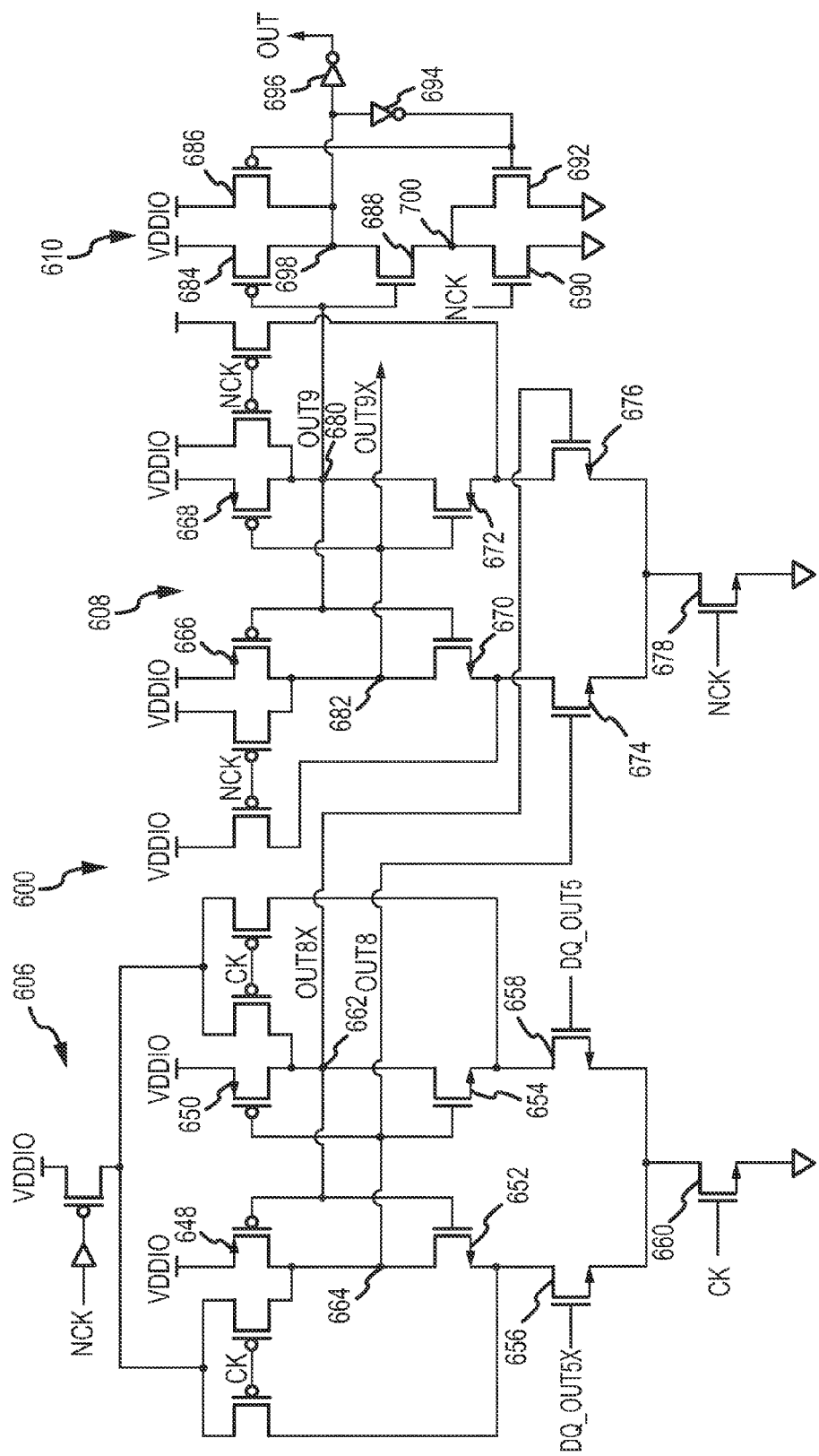
FIG. 8 is a circuit schematic of the final three stages, of an embodiment of a DQ receiver.

The DQ receivers, DQS receivers, and bias circuits described above can be implemented using transistor-based electronic circuits (e.g., NMOS and PMOS transistors) manufactured by a suitable semiconductor fabrication process. In this regard, FIG. 7 is a circuit schematic of the first two stages, and FIG. 8 is a circuit schematic of the final three stages, of an embodiment of a DQ receiver 600. DQ receiver 600 includes a first stage 602, a second stage 604, a third stage 606, a fourth stage 608, and a fifth stage 610. The general configuration and functionality of DQ receiver 600 is consistent with that described above for DQ receiver 300 (FIG. 4), and common features and aspects will not be redundantly described in detail here.

First stage 602 utilizes NMOS transistors configured as a common source cascode linear amplifier with resistor loading. In particular, first stage 602 includes, without limitation: four transistors (reference numbers 612, 614, 616, and 618), a load resistor 620 coupled between the drain of transistor 612 and a supply voltage (VDDIO) node, and a load resistor 622 coupled between the drain of transistor 614 and the supply voltage node. First stage 602 also includes a tail current source 624, which may be realized as one or more transistors.

The VDDIO voltage at the supply voltage node represents the primary (upper) supply voltage used by the I/O circuit of the processor. For DDR2, the VDDIO voltage is nominally 1.8 volts; for DDR3, the VDDIO voltage is nominally 1.5 volts. In other embodiments, VDDIO may be more or less than that required by the DDR2/DDR3 Specification. The example described below uses 2.0 volts for VDDIO as a convenient value. Load resistors 620/622 are selected with consideration of the current generated by the transistors in first stage 602, the value of VDDIO, the load capacitance, and the desired voltage range of DQ_OUT1 and DQ_OUT1X. As one non-limiting example, load resistors 620/622 are each 2.4 kΩ in the illustrated embodiment.

The drain of transistor 612 is coupled to load resistor 620, the gate of transistor 612 is coupled to receive a DC bias voltage (labeled VCAS), and the source of transistor 612 is coupled to the drain of transistor 616. Similarly, the drain of transistor 614 is coupled to load resistor 622, the gate of transistor 614 is coupled to receive VCAS, and the source of transistor 614 is coupled to the drain of transistor 618. VCAS is generated by the associated bias circuitry, and is also used in the DQS receivers. In operation, the bias circuitry determines an appropriate voltage for VCAS, depending upon the particular PVT corner. In other words, VCAS is programmable via the appropriate programming architecture. First stage 602 generates a differential output at the nodes corresponding to the drains of transistor 612 and transistor 614. More specifically, the branch that includes transistor 614 generates DQ_OUT1, and the branch that includes transistor 612 generates DQ_OUT1X.

The drain of transistor 616 is coupled to the source of transistor 612, the gate of transistor 616 is coupled to receive the single-ended DQ IN signal, and the source of transistor 616 is coupled to the source of transistor 618. The drain of transistor 618 is coupled to the source of transistor 614, the gate of transistor 618 is coupled to receive the MemVref reference voltage, and the source of transistor 618 is coupled to the source of transistor 616. The gate of transistor 616 receives the DQ IN signal from the associated memory device, and the gate of transistor 618 receives the MemVref voltage, which is generated by an external supply with an external ground reference. This MemVref voltage is used to slice DQ_IN. The value of MemVref is typically chosen to be half of VDDIO.

Tail current source 624 is coupled between the common source of transistors 616/618 and ground. Tail current source 624 receives the BIAS1 voltage and responds thereto to bias first stage 602 in an appropriate manner.

First stage 602 functions such that it produces dual-rail outputs of a fixed voltage swing from the positive supply voltage rail (VDDIO), regardless of the waveform characteristics (magnitude, rising/falling edge rate, crossover voltage, etc.) of DQ_IN. The output voltage swing is controlled by the BIAS1 voltage via tail current source 624 and load resistors 620/622. In operation, when DQ_IN exceeds MemVref by any amount, transistor 616 turns on and transistor 618 turns off, resulting in a voltage drop across load resistor 620 and no voltage drop across load resistor 622. Thus, first stage 602 will generate DQ_OUT1 and DQ_OUT1X to indicate a logic high value. For this embodiment, DQ_OUT1 transitions to a relatively high voltage when DQ_IN transitions to a voltage that exceeds MemVref, and transitions to a relatively low voltage when DQ_IN transitions to a voltage that does not exceed MemVref.

Figure 9:
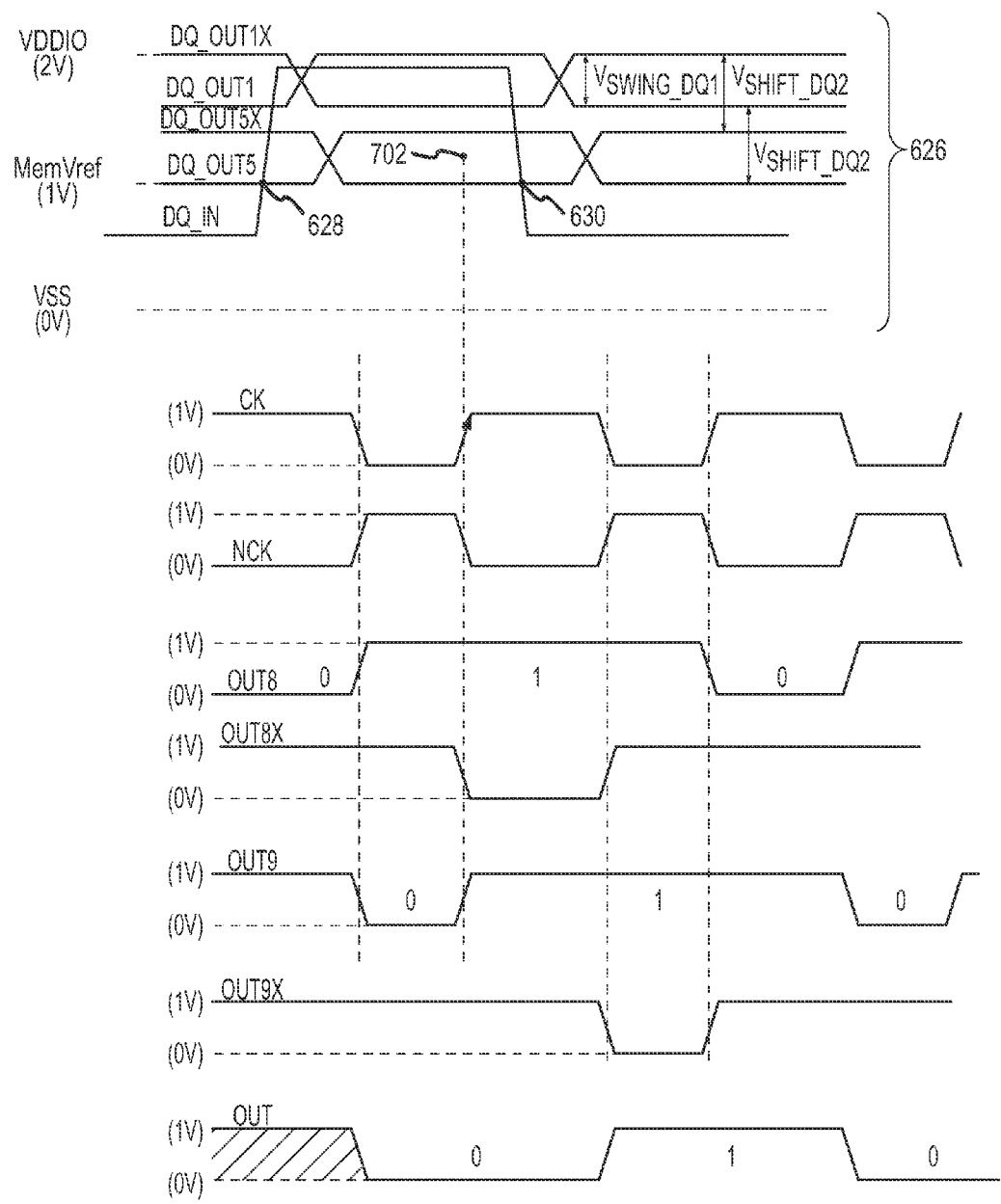
FIG. 9 is a diagram that depicts signals associated with the operation of the DQ receiver shown in FIG. 7 and FIG. 8.

FIG. 9 is a diagram that depicts signals associated with the operation of DQ receiver 600. The upper portion (identified by reference number 626) of FIG. 9 is based on common vertical voltage scale. For convenience, VDDIO equals 2.0 volts, MemVref equals 1.0 volt, and VSS equals 0.0 volts in this example. The point 628 represents the time when DQ_IN crosses the MemVref threshold. In response to this crossing, DQ_OUT1 and DQ_OUT1X transition after a slight delay caused by the practical operating characteristics of first stage 602. The point 630 represents the time when DQ_IN falls below the MemVref threshold. In response to this crossing, DQ_OUT1 and DQ_OUT1X again transition after a slight delay. Notably, first stage 602 will generate an output that represents a logic high value whenever DQ_IN is greater than MemVref (regardless of how much greater), and first stage 602 will generate an output that represents a logic low value whenever DQ_IN is less than MemVref (regardless of how much less).

Referring to FIG. 9, DQ_OUT1 and DQ_OUT1X swing between a relatively high voltage and a relatively low voltage that do not change during normal operation of the DQ receiver. For this particular embodiment, the relatively high voltage level for DQ_OUT1 and DQ_OUT1X is equal to VDDIO (2.0 volts in this example), while the relatively low voltage level for DQ_OUT1 and DQ_OUT1X is equal to VDDIO minus a desired swing voltage ($V_{SWING\_DQ1}$). This example assumes that $V_{SWING\_DQ1}$ equals 0.4 volts. Accordingly, the relatively low voltage level for DQ_OUT1 and DQ_OUT1X will be 1.6 volts for this example. As described in more detail below, the bias circuitry for first stage 602 is suitably configured to control the value of $V_{SWING\_DQ1}$, which represents the nominal expected voltage drop across load resistors 620/622 during operation. This scheme ensures that $V_{SWING\_DQ1}$ is maintained regardless of the actual value of VDDIO and regardless of variation between load resistors 620/622 or manufacturing process variations.

Second stage 604 of DQ receiver 600 is suitably configured to function as a pair of level shifters that downward shift the dual-rail outputs of first stage 602 (DQ_OUT1 and DQ_OUT1X) for compatibility with third stage 606. For embodiments that support both DDR2 and DDR3, the voltage shift introduced by second stage 604 will be different for DDR2 and DDR3. Referring to FIG. 7, this embodiment of second stage 604 includes, without limitation: two PMOS transistors 632/634; eight NMOS transistors (reference numbers 636, 638, 640, 642, 643, 645, 647, and 649); a first tail current source 644 that includes transistors 643 and 647; and a second tail current source 646 that includes transistors 645 and 649. One section of second stage 604 is configured to shift the non-inverted component (DQ_OUT1) by the designated shift voltage, and another section of second stage 604 is configured to shift the inverted component (DQ_OUTX) by the same designated shift voltage.

The source of transistor 632 is coupled to the VDDIO supply, the gate of transistor 632 is coupled to receive a control voltage (labeled DDR3_TDX), and the drain of transistor 632 is coupled to the drain of transistor 638. The drain of transistor 636 is coupled to the VDDIO supply, the gate of transistor 636 receives DQ_OUT1 from first stage 602, and the source of transistor 636 is coupled to a node 637. The drain of transistor 638 is coupled to the drain of transistor 632, the gate of transistor 638 also receives DQ_OUT1 from first stage 602, and the source of transistor 638 is coupled to the node 637.

The source of transistor 634 is coupled to the VDDIO supply, the gate of transistor 634 is coupled to receive DDR3_TDX, and the drain of transistor 634 is coupled to the drain of transistor 642. The drain of transistor 640 is coupled to the VDDIO supply, the gate of transistor 640 receives DQ_OUT1X from first stage 602, and the source of transistor 640 is coupled to a node 641. The drain of transistor 642 is coupled to the drain of transistor 634, the gate of transistor 642 also receives DQ_OUT1X from first stage 602, and the source of transistor 642 is coupled to the node 641.

The drain of transistor 643 is coupled to the node 637, the gate of transistor 643 receives a DC voltage (VTT, which is nominally half of VDDIO in this example), and the source of transistor 643 is coupled to the drain of transistor 647. Similarly, the drain of transistor 645 is coupled to the node 641, the gate of transistor 645 receives VTT, and the source of transistor 645 is coupled to the drain of transistor 649. As shown, transistor 647 is coupled between transistor 643 and ground, while transistor 649 is coupled between transistor 645 and ground. In this embodiment, tail current source 644 is configured as a cascode arrangement of transistors 643/647, and tail current source 646 is configured as a cascode arrangement of transistors 645/649. Notably, transistors 643/645 provide over-voltage protection for transistors 647/649, because they prevent the drain of transistor 647 and the drain of transistor 649 from reaching VDDIO (which could cause the gate-to-drain voltage to exceed the gate oxide breakdown voltage). Tail current source 644 receives the BIAS5 voltage and responds thereto to bias the respective portion of second stage 604 in an appropriate manner. Similarly, tail current source 646 also receives the BIAS5 voltage and responds thereto to bias the respective portion of second stage 604 in an appropriate manner.

Second stage 604 functions to downwardly shift DQ_OUT1 and DQ_OUT1X into lower voltage equivalents DQ_OUT5 and DQ_OUT5X, respectively. The associated bias circuitry influences, dictates, and controls the shift voltage introduced by second stage 604. As mentioned above, the voltage shift amount for DDR2 devices is different than the voltage shift amount for DDR3 devices (the desired voltage shift for DDR3 is less than the desired voltage shift for DDR2). Accordingly, this embodiment utilizes transistors 632/634 to switch between operation in a DDR2 mode or a DDR3 mode. For this example, when DDR3_TDX is high, transistor 632 and transistor 634 turn on, which in turn causes the voltage shift reflected in DQ_OUT5 and DQ_OUT5X to be less, compared to when DDR3_TDX is low.

The output signal DQ_OUT5 is taken at node 637, i.e., the common source node of transistors 636/638, and the output signal DQ_OUT5X is taken at node 641, i.e., the common source node of transistors 640/642. Referring again to FIG. 9, DQ_OUT5 equals DQ_OUT1 minus the designated shift voltage ($V_{SHIFT\_DQ2}$), and DQ_OUT5X equals DQ_OUT1X minus $V_{SHIFT\_DQ2}$. This example assumes that $V_{SHIFT\_DQ2}$ equals 0.6 volts. Accordingly, the relatively high voltage level for DQ_OUT5 and DQ_OUT5X will be VDDIO minus $V_{SHIFT\_DQ2}$, or 1.4 volts for this example. Similarly, the relatively low voltage level for DQ_OUT5 and DQ_OUT5X will be VDDIO minus $V_{SWING\_DQ1}$ minus $V_{SHIFT\_DQ2}$, or 1.0 volts for this example. Notably, second stage 604 preserves $V_{SWING\_DQ1}$ between DQ_OUT5 and DQ_OUT5X (0.4 volts in this example). As described in more detail below, the bias circuit architecture for DQ receiver 600 is suitably configured to bias the linear receiver portion with BIAS1 and BIAS5 such that the differential output signal (DQ_OUT5 and DQ_OUT5X) swings between the specified upper voltage level and the specified lower voltage level.

Third stage 606 and fourth stage 608 function as back-to-back sampling amplifier stages, where third stage 606 is configured as a first sense amplifier and fourth stage 608 is configured as a second sense amplifier. Third stage 606 is clocked by the non-inverted CK signal, and fourth stage 608 is clocked by the inverted NCK signal to reduce metastability issues. The use of clocked sense amplifiers in this manner provides benefits over existing approaches that use non-clocked sense amplifiers. Notably, third stage 606 and fourth stage 608 reside in DQ receiver 600 itself to reduce DQ-to-DQ skew between signals clocked by a common DQS signal. Such skew would otherwise be caused by buffering the receiver output at the analog-to-digital interface and by route mismatches associated with the DQ receivers processing a byte, or by route mismatches associated with the DQS receiver used for the byte. Incorporating third stage 606 and fourth stage 608 into DQ receiver 600 and the analog front end stages enables DQ_OUT5 and DQ_OUT5X to be immediately sensed and converted into a usable digital signal.

This embodiment of third stage 606 includes, without limitation: two PMOS transistors 648/650; four NMOS transistors (reference numbers 652, 654, 656, and 658), and an NMOS transistor 660 that receives the CK signal. The source of transistor 648 is coupled to VDDIO, the gate of transistor 648 is coupled to a node 662, and the drain of transistor 648 is coupled to a node 664. One output of third stage 606 represents a first sampled output signal (labeled OUT8X—provided at node 662), and another output of third stage 606 represents a second sampled output signal (labeled OUT8—provided at node 664). The source of transistor 650 is coupled to VDDIO, the gate of transistor 650 is coupled to node 664, and the drain of transistor 650 is coupled to node 662.

The drain of transistor 652 is coupled to node 664, the gate of transistor 652 is coupled to node 662, and the source of transistor 652 is coupled to the drain of transistor 656. Similarly, the drain of transistor 654 is coupled to node 662, the gate of transistor 654 is coupled to node 664, and the source of transistor 654 is coupled to the drain of transistor 658. The drain of transistor 656 is coupled to the source of transistor 652, the gate of transistor 656 receives DQ_OUT5X from second stage 604, and the source of transistor 656 is coupled to the source of transistor 658. Likewise, the drain of transistor 658 is coupled to the source of transistor 654, the gate of transistor 658 receives DQ_OUT5 from second stage 604, and the source of transistor 658 is coupled to the source of transistor 656. The drain of transistor 660 is coupled to the common source node of transistors 656/658, the gate of transistor 660 receives the CK signal, and the source of transistor 660 is grounded.

Third stage 606 is suitably configured to generate DQ_OUT8 and DQ_OUT8X in response to DQ_OUT5, DQ_OUT5X, and the CK signal. In operation, third stage 606 is precharged when CK is low and NCK is high. In other words, node 662 and node 664 (and, in turn, OUT8 and OUT8X) are precharged to a designated voltage level (referred to herein as VTT). Thus, third stage 606 samples its input on the rising edge of CK, and it maintains its output on nodes 662/664 until the falling edge of CK, when OUT8 and OUT8X get precharged to VTT. For this embodiment, VTT is the mid-rail supply voltage level, which is typically half the VDDIO voltage. When CK transitions from low-to-high, third stage 606 begins to quickly evaluate its inputs (DQ_OUT5 and DQ_OUT5X) and, in response, adjust its outputs (OUT8 and OUT8X). On the other hand, when CK transitions from high-to-low, OUT8 and OUT8X both transition to the relatively high VTT voltage. For example, when CK transitions from low-to-high, if DQ_OUT5 is greater than DQ_OUT5X, then third stage 606 will cause the voltage at node 662 (OUT8X) to be pulled down to ground, while the voltage at node 664 (OUT8) will remain at VTT. The converse applies if DQ_OUT5X is greater than DQ_OUT5 when CK transitions from low-to-high. The exemplary CK, NCK, OUT8, and OUT8X signals in FIG. 9, which share a common time axis with the upper portion 626 of FIG. 9, illustrate the operation of third stage 606. For this example, VTT is equal to 1.0 volt.

Referring again to FIG. 7, the desired values of $V_{SWING\_DQ1}$ and $V_{SHIFT\_DQ2}$ are dictated by the operating characteristics and preferences of third stage 606. In this regard, for different PVT combinations the bias circuit architecture calculates the optimal common mode voltage for third stage 606 and the optimal input voltage swing for third stage

606, where the common mode voltage is the average of the two inputs (DQ_OUT5 and DQ_OUT5X) of third stage 606. In practice, the bias circuit architecture generates appropriate bias voltages for DQ receiver 600 that facilitate optimal operation of third stage 606 over different anticipated PVT corners. Again, the example described here assumes that VDDIO equals 2.0 volts, VTT equals 110 volt, $V_{SWING\_DQ1}$ equals 0.4 volts, and $V_{SHIFT\_DQ2}$ equals 0.6 volts.

The output of third stage 606 serves as an input to fourth stage 608. This embodiment of fourth stage 608 includes, without limitation: two PMOS transistors 666/668; four NMOS transistors (reference numbers 670, 672, 674, and 676), and an NMOS transistor 678 that receives the NCK signal. The source of transistor 666 is coupled to VDDIO, the gate of transistor 666 is coupled to a node 680, and the drain of transistor 666 is coupled to a node 682. One output of fourth stage 608 represents a binary output signal (labeled OUT9—provided at node 680), and another output of fourth stage 608 (labeled OUT9X) is provided at node 682. The source of transistor 668 is coupled to VDDIO, the gate of transistor 668 is coupled to node 682, and the drain of transistor 668 is coupled to node 680.

The drain of transistor 670 is coupled to node 682, the gate of transistor 670 is coupled to node 680, and the source of transistor 670 is coupled to the drain of transistor 674. Similarly, the drain of transistor 672 is coupled to node 680, the gate of transistor 672 is coupled to node 682, and the source of transistor 672 is coupled to the drain of transistor 676. The drain of transistor 674 is coupled to the source of transistor 670, the gate of transistor 674 receives OUT8 from third stage 606, and the source of transistor 674 is coupled to the source of transistor 676. Likewise, the drain of transistor 676 is coupled to the source of transistor 672, the gate of transistor 676 receives OUT8X from third stage 606, and the source of transistor 676 is coupled to the source of transistor 674. The drain of transistor 678 is coupled to the common source node of transistors 674/676, the gate of transistor 678 receives the NCK signal, and the source of transistor 678 is grounded.

Fourth stage 608 is suitably configured to generate DQ_OUT9 in response to DQ_OUT8, DQ_OUT8X, and the NCK signal. The operation of fourth stage 608 is analogous to that of third stage 606. Fourth stage 608 samples its input on the rising edge of NCK, and it maintains its output on nodes 680/682 until the falling edge of NCK, when OUT9 and OUT9X get precharged to VTT. Fourth stage 608 precharges nodes 680/682 (and, in turn, OUT9 and OUT9X) to VTT when NCK is low and CK is high. When NCK transitions from low-to-high, fourth stage 608 begins to quickly evaluate its inputs (OUT8 and OUT8X) and, in response, adjust its outputs (OUT9 and OUT9X). On the other hand, when NCK transitions from high-to-low, OUT9 and OUT9X both transition to the relatively high VTT voltage. For example, when NCK transitions from low-to-high, if OUT8 is greater than OUT8X, then fourth stage 608 will cause the voltage at node 682 (OUT9X) to be pulled down to ground, while the voltage at node 680 (OUT9) will remain at VTT. The converse applies if OUT8X is greater than OUT8 when NCK transitions from low-to-high. The exemplary OUT9, and OUT9X signals in FIG. 9, which share a common time axis with the upper portion 626 of FIG. 9, illustrate the operation of fourth stage 608.

Third stage 606, in conjunction with fourth stage 608, converts a very small swing voltage (represented by DQ_OUT5 and DQ_OUT5X) into an output signal (represented by OUT9 and OUT9X) having a larger voltage swing that is within the voltage domain of the processor. In this example, third stage 606 and fourth stage 608 transform an input having a 0.4 volt swing into an output that varies between 0.0 volt (corresponding to logic low) and 1.0 volt (corresponding to logic high). OUT9 is fed to fifth stage 610, and OUT9X, which is unused in this embodiment, may be fed to an output matching element (not shown) for purposes of balancing the output of fourth stage 608.

Fifth stage 610 of DQ receiver 600 is suitably configured to function as a zero catcher and buffer that catches the falling edge of the OUT9 signal, and quickly buffers and propagates it to the output to meet timing requirements. Fifth stage 610 is utilized in this embodiment because OUT9 and OUT9X have valid output values only when NCK transitions from low-to-high. Otherwise, OUT9 and OUT9X are invalid because fourth stage 608 is precharging when NCK is low. Fifth stage 610 maintains the valid output of OUT9 during the entire clock cycle, even when NCK is high.

Referring to FIG. 8, this embodiment of fifth stage 610 includes, without limitation: two PMOS transistors 684/686; three NMOS transistors (reference numbers 688, 690, and 692); and two inverters 694/696. The source of transistor 684 is coupled to the VDDIO supply, the gate of transistor 684 is coupled to the gate of transistor 688, and the drain of transistor 684 is coupled to a node 698. The gate of transistor 684 is also coupled to fourth stage 608, to receive OUT9 as an input. The source of transistor 686 is also coupled to the VDDIO supply, the gate of transistor 686 is coupled to the gate of transistor 692, and the drain of transistor 686 is coupled to node 698. The drain of transistor 688 is coupled to node 698, the gate of transistor 688 is coupled to the gate of transistor 684, and the source of transistor 688 is coupled to a node 700.

The drain of transistor 690 is coupled to node 700, the gate of transistor 690 receives the NCK signal, and the source of transistor 690 is coupled to ground. The drain of transistor 692 is coupled to node 700, the gate of transistor 692 is coupled to the gate of transistor 686, and the source of transistor 692 is coupled to ground. Inverter 694 has an input end coupled to node 698 and an output end coupled to the gate of transistor 686 and to the gate of transistor 692. Inverter 696 has an input end coupled to node 698 and an output end from which the overall output of DQ receiver (labeled OUT) is taken.

The operation of fifth stage 610 will be described with reference to FIG. 9 and, in particular, with reference to the OUT9 and OUT plots of FIG. 9. Referring to the OUT9 plot, the zero bit periods are only valid for one half of the NCK cycle. When the NCK signal transitions from low-to-high, fifth stage 610 responds by passing the current OUT9 level and maintaining it until the next low-to-high transition. For this example, the first zero bit in the OUT signal has been extended throughout one NCK clock cycle. At the second low-to-high transition of NCK, OUT9 is at the relatively high 1.0 volt level. Accordingly, fifth stage 610 maintains the one bit in the OUT signal throughout that NCK clock cycle. At the third low-to-high transition of NCK, OUT9 is at the relatively low 0.0 volt level. Consequently, fifth stage 610 maintains the zero bit in the OUT signal throughout that NCK clock cycle, resulting in a zero, one, zero bit pattern.

Figure 10:
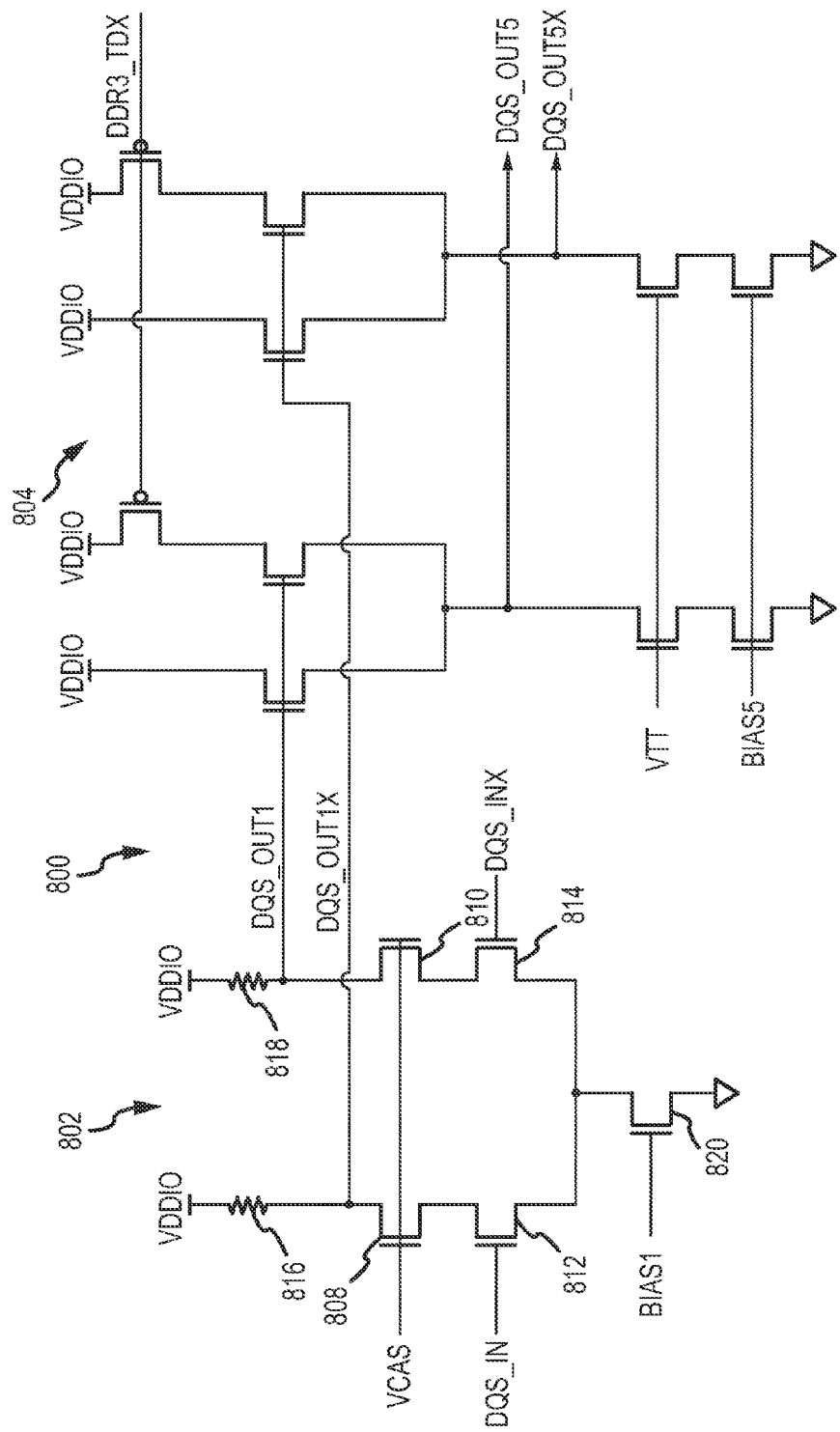
FIG. 10 is a circuit schematic of the first two stages.
Figure 11:
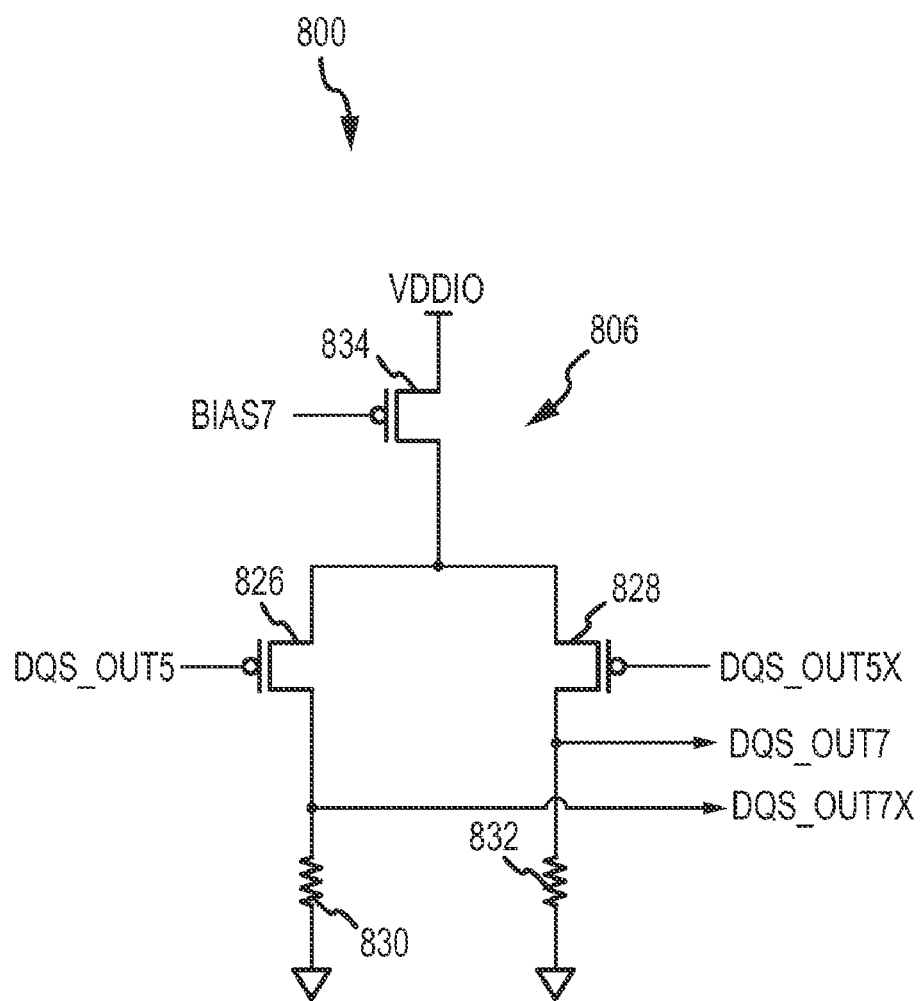
FIG. 11 is a circuit schematic of the final stage, of an embodiment of a DQS receiver.

The DQS receivers can also be implemented using transistor-based electronic circuits. In this regard, FIG. 10 is a circuit schematic of the first two stages, and FIG. 11 is a circuit schematic of the final stage, of an embodiment of a DQS receiver 800. DQS receiver 800 generally includes a first stage 802, a second stage 804, and a third stage 806. The general configuration and functionality of DQS receiver 800 is consistent with that described above for DQS receiver 400 (FIG. 5), and common features and aspects will not be redundantly described in detail here.

First stage 802 utilizes NMOS transistors configured as a common source cascode linear amplifier with resistor loading. In particular, first stage 802 includes, without limitation: four transistors (reference numbers 808, 810, 812, and 814), a load resistor 816 coupled between the drain of transistor 808 and VDDIO, and a load resistor 818 coupled between the drain of transistor 810 and VDDIO. Load resistors 816/818 are selected according to the current generated by the transistors in first stage 802, the value of VDDIO, and the desired voltage range of DQS_OUT 1 and DQS_OUT 1X. As one non-limiting example, load resistors 816/818 are each 1.6 kΩ in the illustrated embodiment. First stage 802 also includes a tail current source 820, which may be realized as one or more transistors.

The general topology and operation of first stage 802 is similar to that described above for first stage 602 of DQ receiver 600, and common features and aspects will not be redundantly described here in the context of DQS receiver 800. For first stage 802, the gate of transistor 812 receives DQS_IN from the associated memory device, and the gate of transistor 814 receives DQS_INX from the associated memory device. More specifically, the branch that includes transistor 810 generates DQS_OUT1, and the branch that includes transistor 808 generates DQS_OUT1X. Tail current source 820 is coupled between the common source of transistors 812/814 and ground. Notably, tail current source 820 receives the same BIAS 1 voltage that is used to bias the first stage of all DQ receivers that are clocked with CK and NCK signals derived from the output of DQS receiver 800.

First stage 802 functions to transform the differential DQS input signal into a differential output signal (DQS_OUT1 and DQS_OUT1X) having a designated voltage swing from the positive supply voltage rail (VDDIO), regardless of the waveform characteristics (magnitude, rising/falling edge rate, crossover voltage, etc.) of the DQS signal. For this embodiment, the differential output signal swings between an upper supply voltage (VDDIO) and a relatively low voltage that corresponds to VDDIO minus a swing voltage. The output voltage swing of first stage 802 is controlled by the BIAS1 voltage via tail current source 820 and load resistors 816/818. In operation, when DQS_IN is less than DQS_INX, then DQS_OUT1X will be pulled to VDDIO and DQS_OUT1 will be VDDIO minus the desired swing voltage ($V_{SWING\_DQS1}$). Conversely, when DQS_IN is greater than DQS_INX, then DQS_OUT1 will be pulled to VDDIO and DQS_OUT1X will be VDDIO minus $V_{SWING\_DQS1}$.

Figure 12:
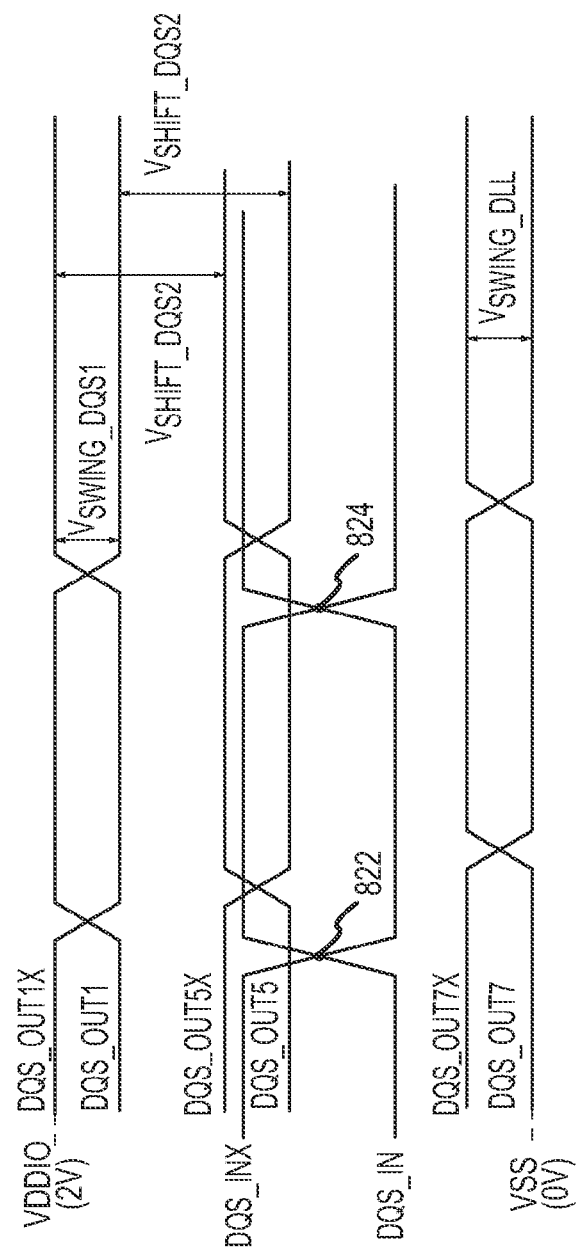
FIG. 12 is a diagram that depicts signals associated with the operation of the DQS receiver shown in FIG. 10 and FIG. 11.

FIG. 12 is a diagram that depicts signals associated with the operation of DQS receiver 800. For this example, VDDIO equals 2.0 volts, VTT equals 1.0 volt, and VSS equals 0.0 volts. The point 822 represents the time when DQS transitions, i.e., when DQS_IN crosses DQS_INX. In response to this crossing, DQS_OUT1 and DQS_OUT1X transition after a slight delay caused by the practical operating characteristics of first stage 802. The point 824 represents the next transition of DQS. In response to this subsequent crossing, DQS_OUT1 and DQS_OUT1X again transition after a slight delay. FIG. 12 illustrates how $V_{SWING\_DQS1}$ represents a specified voltage drop from VDDIO.

The value of $V_{SWING\_DQS1}$ is programmed to be equal to $V_{SWING\_DQ1}$ multiplied by the ratio of the branch load resistors in DQS receiver 800 and DQ receiver 600. The ratio is chosen to properly bias DQS receiver 800 such that it propagates a non-distorted waveform to its third stage 806, while at the same time causing DQ receiver 600 to experience a large enough voltage swing. For this particular example, the ratio is $$\frac{1.6}{2.4} = 0.667$$

and $V_{SWING\_DQ1}$ equals 0.4 volts. Thus, $V_{SWING\_DQS1}$ equals 0.267 volts for this example. Accordingly, the relatively high voltage level for DQS_OUT1 and DQS_OUT1X will be VDDIO (2.0 volts in this example), while the relatively low voltage level for DQS_OUT1 and DQS_OUT1X will be 1.733 volts. As described in more detail below, the bias circuitry for first stage 802 is suitably configured to control the value of $V_{SWING\_DQS1}$, which represents the nominal expected voltage drop across load resistors 816/818 during operation. This scheme ensures that $V_{SWING\_DQS1}$ is maintained regardless of the actual value of VDDIO and regardless of variation between load resistors 816/818.

Second stage 804 of DQS receiver 800 is suitably configured to function as a level shifter that downward shifts the dual-rail outputs of first stage 802 (DQS_OUT1 and DQS_OUT1X) for compatibility with third stage 806. For this embodiment, second stage 804 is identical to second stage 604 of DQ receiver 600, except for its input and output signals and associated voltage levels. Moreover, second stage 804 is biased with the same BIAS5 voltage that is used to bias the second stage of all DQ receivers that are clocked with CK and NCK signals derived from the output of DQS receiver 800. For the sake of brevity, and because the above description of second stage 604 also generally applies here, second stage 804 will not be redundantly described in detail here.

Second stage 804 receives as inputs the DQS_OUT1 and DQS_OUT1X signals from first stage 802. Second stage 804 performs level shifting on these input signals to generate output signals DQS_OUT5 and DQS_OUT5X. Referring again to FIG. 12, DQS_OUT5 equals DQS_OUT1 minus the designated shift voltage ($V_{SHIFT\_DQS2}$), and DQS_OUT5X equals DQS_OUT1X minus $V_{SHIFT\_DQS2}$. Although this example assumes that $V_{SHIFT\_DQS2}$ equals 0.6 volts, which is the same as $V_{SHIFT\_DQ2}$, these two shift voltages need not be equal. Accordingly, the relatively high voltage level for DQS_OUT5 and DQS_OUT5X will be VDDIO minus $V_{SHIFT\_DQS2}$, or 1.4 volts for this example. Similarly, the relatively low voltage level for DQS_OUT5 and DQS_OUT5X will be VDDIO minus $V_{SWING\_DQS1}$ minus $V_{SHIFT\_DQS2}$, or 1.133 volts for this example. Notably, second stage 804 preserves $V_{SWING\_DQS1}$ between DQS_OUT5 and DQS_OUT5X (0.267 volts in this example).

Third stage 806 is suitably configured as a common source linear amplifier with resistor loading. This embodiment of third stage 806 includes, without limitation: two PMOS transistors 826/828; a load resistor 830 coupled between the drain of transistor 826 and ground; a load resistor 832 coupled between the drain of transistor 828 and ground; and a tail current source 834, which may be realized as one or more transistors. Here, tail current source 834 is a PMOS transistor. The source of transistor 826 is coupled to the source of transistor 828, and to tail current source 834. The gate of transistor 826 is coupled to second stage 804 of DQS receiver 800, and it receives the DQS_OUT5 signal. The drain of transistor 826 is coupled to one end of load resistor 830. Similarly, the source of transistor 828 is coupled to the source of transistor 826, and to tail current source 834. The gate of transistor 828 is coupled to second stage 804 of DQS receiver 800, and it receives the DQS_OUT5X signal. The drain of transistor 828 is coupled to one end of load resistor 832.

Tail current source 834 is coupled between the common source of transistors 826/828 and VDDIO. Tail current source 834 receives the BIAS7 voltage (see FIG. 5 and FIG. 6) and responds thereto such that third stage 806 is biased so as to provide a particular voltage swing at its output. One output of third stage 806 (DQS_OUT7) is taken at the drain of transistor 828, and the other output (DQS_OUT7X) is taken at the drain of transistor 826. The output of third stage 806 is a differential output that represents a downward shifted and slightly delayed version of the differential input (DQS_OUT5 and DQS_OUT5X).

Third stage 806 operates in the following manner to transform its differential input signal (DQS_OUT5 and DQS_OUT5X for this example) into a differential output signal (DQS_OUT7 and DQS_OUT7X for this example) that swings between a lower supply voltage (e.g., VSS or ground) and a relatively high voltage that corresponds to VSS plus a swing voltage. When DQS_OUT5 is relatively low and DQS_OUT5X is relatively high, then DQS_OUT7 will be pulled to ground (which corresponds to VSS or 0.0 volts) and DQS_OUT7 will be at VSS plus a desired swing voltage ($V_{SWING\_DLL}$). Conversely, when DQS_OUT5 is relatively high and DQS_OUT5X is relatively low, then DQS_OUT7X will be pulled to ground and DQS_OUT7 will be at VSS plus $V_{SWING\_DLL}$. The value of $V_{SWING\_DLL}$ is chosen for compatibility with the DLL with which third stage 806 cooperates (see FIG. 2 and accompanying description). For this embodiment, $V_{SWING\_DLL}$ equals 0.4 volts. The bias circuitry for third stage 806 is suitably configured to control the value of $V_{SWING\_DLL}$, which represents the nominal expected voltage drop across resistors 830/832 during operation. In addition, using VSS as the low voltage reference may be a requirement of the DLL.

The DLL acts to provide a calibrated delay which will align the rising edges of the CK signal such that the rising edges occur in the middle of the eye defined by DQ_OUT5 and DQ_OUT5X. In FIG. 9, the point 702 indicates this timing relationship of CK relative to DQ_OUT5 and DQ_OUT5X. This timing ensures that the sense amplifiers do not sample the signals near a transition point. Accordingly, the DQS receiver and the DLL can be cooperatively configured in this manner to generate CK/NCK with transition edge timing such that CK/NCK can be used to sample the output signals of multiple DQ receivers at a sampling time that occurs when all of the output signals are well-settled. This timing characteristic ensures that the output signals are not sampled at potentially invalid times when the output signals are transitioning between logic high and low states.

Referring again to FIG. 6, the DQ receivers and DQS receivers in a computer system can cooperate with a programming architecture 500 that generates the BIAS1, BIAS5, and BIAS7 voltages mentioned above. Furthermore, programming architecture 500 can be utilized to generate the VCAS voltage mentioned above. Programming architecture 500 is suitably configured to automatically set the desired operating conditions for any defined PVT corner. In particular, it generates PVT-dependent bias voltages for the DQ receivers and DQS receivers described above. In practice, the particular swing voltages, shift voltages, and common-mode output voltages (for both DDR2 and DDR3 modes) are optimized using simulation techniques prior to manufacturing of the processor device. Then, the optimized settings are stored as digital BIOS-accessible registers with power-up and reset defaults converting to analog bias voltages using digital-to-analog converters. These settings can be reevaluated by characterization tests after manufacturing (e.g., at each major production cycle). When the manufacturing process shifts by some amount, the I/O receiver circuitry can remain optimized without any design changes by adjusting the register settings that influence the operation of programming architecture 500. If the register settings have been shifted beyond the normal operating window, it is an indication that significant process changes have occurred. By detecting the direction or trend of the register setting changes, one can determine the portion of the receiver design that might need to be re-optimized or re-designed.

Figure 13:
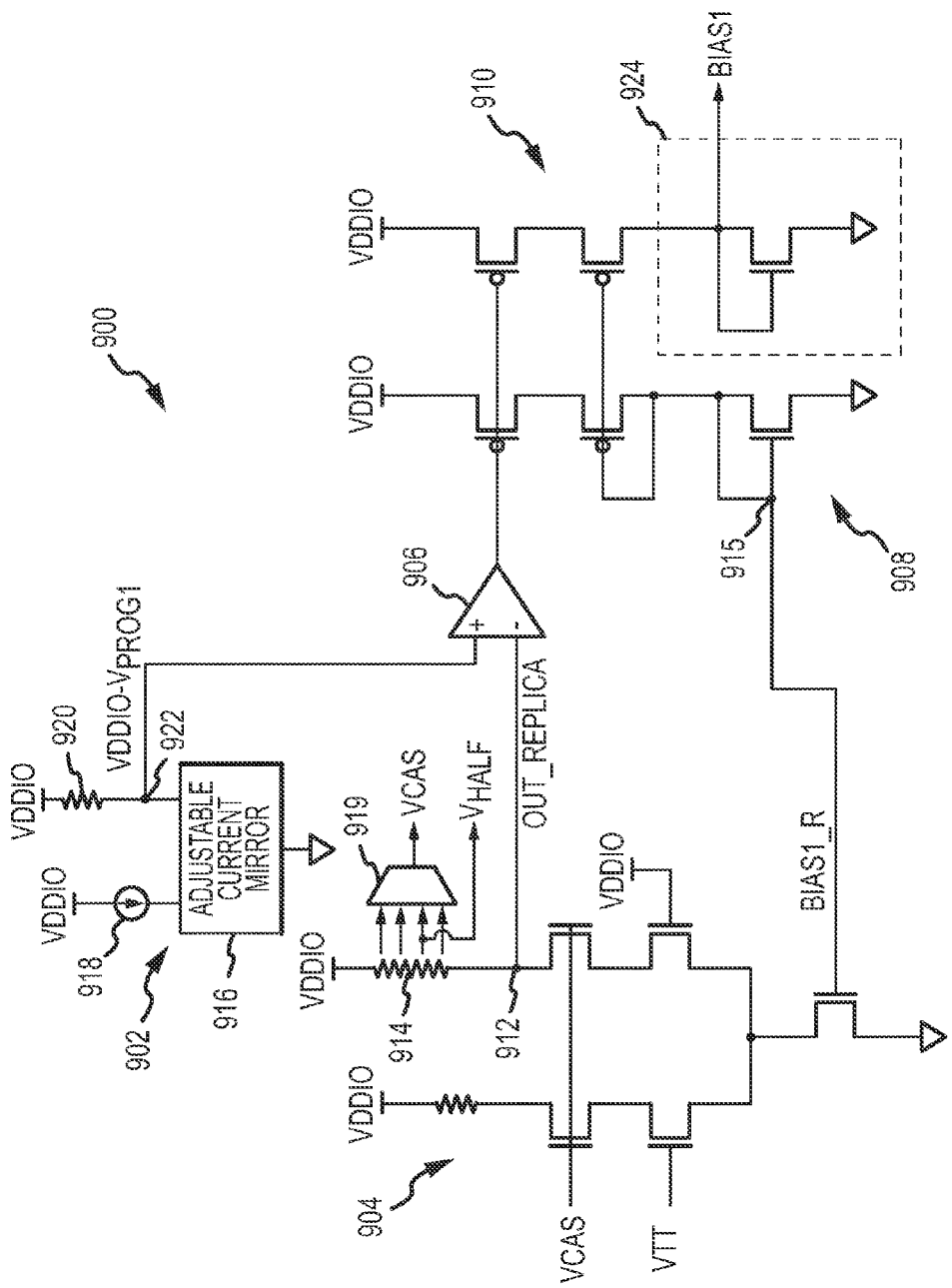
FIG. 13 is a circuit schematic of an embodiment of a first bias circuit suitable for use with a DQ/DQS receiver.

FIG. 13 is a circuit schematic of an embodiment of a first bias circuit 900 suitable for use with a DQ/DQS receiver. Bias circuit 900 represents one suitable embodiment of a circuit that generates the BIAS1 voltage referred to above. Bias circuit 900 is a replica circuit in that it contains a replica of the circuit to which the BIAS1 voltage is applied. The replica circuit is placed in a feedback loop, and the output of the feedback loop generates a replica bias voltage for the replica circuit. Ultimately, bias circuit 900 strives to duplicate this replica bias voltage as the BIAS1 voltage.

Bias circuit 900 generally includes, without limitation: a reference voltage generator 902; a receiver replica stage 904; a comparator 906; a variable current source 908 coupled to the output node of comparator 906; and a current mirror 910 coupled to variable current source 908. Receiver replica stage 904 has an output node (node 912 in this example) coupled to the negative input node of comparator 906, and a bias input node coupled to a bias voltage node 915. In this embodiment, the bias input node for receiver replica stage 904 corresponds to bias voltage node 915. Receiver replica stage 904 is configured to mimic the operation of first stage 602 of DQ receiver 600 (see FIG. 7) and/or first stage 802 of DQS receiver 800 (see FIG. 10). Unlike the counterpart first stages 602/802, however, receiver replica stage 904 uses fixed DC voltages at the gates of the two input transistors. In particular, VDDIO and VTT (which by definition is less than VDDIO) are used to force receiver replica stage 904 into a condition such that the replica output generated at node 912 equals VDDIO minus the voltage drop across a load resistance 914. Notably, receiver replica stage 904 is biased with an internal bias voltage (labeled BIAS1_R) that is generated by variable current source 908 at bias voltage node 915. In FIG. 13, the voltage at node 912 is labeled OUT_REPLICA.

For this embodiment, about one-half of OUT_REPLICA is provided to another bias circuit (to be described below). In FIG. 13, this half voltage is labeled $V_{HALF}$. This half voltage may be obtained, for example, by dividing load resistance 914 in half and accessing the node between the two resistors. In this regard, load resistance 914 may be realized as a plurality of series resistors with various tap points or nodes therebetween. As depicted in FIG. 13, the voltage at one of these tap nodes corresponds to $V_{HALF}$. The exemplary embodiment described here includes a multiplexer, switch, or any suitable selection element 919 that receives voltages corresponding to different tap nodes of load resistance 914. Selection element 919 is programmed or otherwise controlled to select one of its input voltages for use as the VCAS voltage. The non-limiting example shown in FIG. 13 includes four input voltages, thus, selection element 919 can be digitally controlled using two control bits. In practice, these control bits may be provided by program memory element 508 (FIG. 6).

In operation, bias circuit 900 strives to bias receiver replica stage 904 with BIAS1_R such that the voltage of OUT_REPLICA is equal to the output generated by reference voltage generator 902. In FIG. 13, this reference voltage is labeled VDDIO-$V_{PROG1}$. In this embodiment, reference voltage generator 902 includes, without limitation: an adjustable current mirror 916 coupled between the positive input node of comparator 906 and a reference voltage (e.g., ground) node; a voltage-to-current element 918 coupled between VDDIO and adjustable current mirror 916; and a load resistor 920 coupled between VDDIO and the positive input node of comparator 906. The voltage-to-current element 918 provides a current proportional to an absolute voltage (provided by a bandgap reference circuit) divided by a resistor appropriately ratioed to load resistor 920. Reference voltage generator 902 is suitably configured to set the reference voltage at node 922 to a particular programmable amount, which can be varied to accommodate different PVT conditions. In certain embodiments, the value of $V_{PROG1}$ is dependent upon a BIOS-programmable digital code (e.g., a four-bit code that provides sixteen different possible values) that enables the host computer system to write to the registers of the I/O circuit to program the operation of bias circuit 900. Preferably, bias circuit 900 employs a power-up default code value, which is determined by pre-silicon simulations, that results in the desired value of VDDIO−$V_{PROG1}$. Bias circuit 900 may use the programmable code value in an appropriate algorithm or formula to calculate the value of $V_{PROG1}$. In one exemplary embodiment, the default code value results in a reference voltage of VDDIO−0.560 volts, and that reference voltage is achieved by tuning adjustable current mirror 916 in an appropriate manner. Thus, adjustable current mirror 916 is suitably controlled to cause a programmable voltage drop across load resistor 920, given the reference current supplied by the voltage-to-current element 918. The reference voltage in one exemplary embodiment equals the bandgap voltage times the ratio of load resistor 920 to the resistor in voltage-to-current element 918, times the current mirror ratio of adjustable current mirror 916, which is programmed by the code mentioned previously.

As shown in FIG. 13, the reference voltage at node 922 (VDDIO−$V_{PROG1}$) is applied to the positive input node of comparator 906, and the output of replica circuit at node 912 (OUT_REPLICA) is applied to the negative input node of comparator 906. The feedback loop of bias circuit 900 adjusts OUT_REPLICA until it equals VDDIO−$V_{PROG1}$, within practical tolerances. The comparator 906 generates a current control voltage at its output node, where the control voltage will vary depending upon a comparison of the reference voltage and OUT_REPLICA. In turn, the current control voltage produced by comparator 906 will control the amount of current generated by variable current source 908. In this manner, the current of variable current source 908 is dependent on the current control voltage. The amount of current generated by variable current source 908 influences the voltage of BIAS1_R, which is fed back as the bias voltage for receiver replica stage 904. Ultimately, when the feedback loop reaches steady state, BIAS1_R will cause receiver replica stage 904 to be properly biased, resulting in the desired OUT_REPLICA voltage.

Current mirror 910 is coupled to variable current source 908 such that an output transistor element 924 generates the desired BIAS1 voltage (which mimics the internal BIAS1_R voltage). As mentioned above, the BIAS 1 voltage is used to bias the counterpart receiver stage in the receiver architecture. When implemented in a processor device, one instantiation of bias circuit 900 may support multiple DQ receivers and multiple DQS receivers. In this regard, a single instantiation of bias circuit 900 may drive multiple instantiations of output transistor element 924. Moreover, one instantiation of output transistor element 924 may drive a plurality of DQ receivers and/or a plurality of DQS receivers. Such a hierarchical bias circuit architecture may be desirable to accommodate the practical needs, operating characteristics, and specifications of the processor device. In particular, it will save DC current consumption over an embodiment that uses a replica bias circuit for each and every DQ and DQS receiver.

Figure 14:
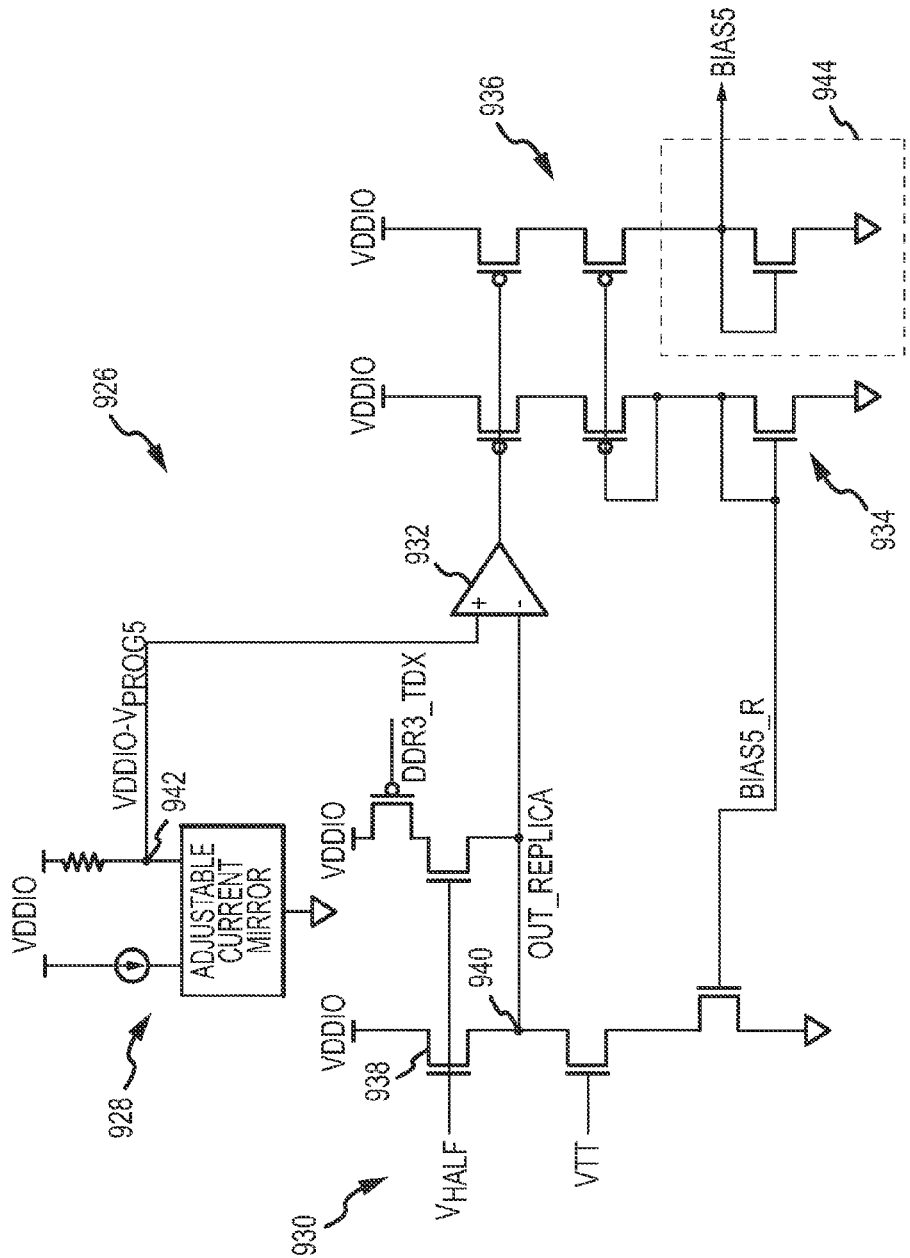
FIG. 14 is a circuit schematic of an embodiment of a second bias circuit suitable for use with a DQ/DQS receiver.

FIG. 14 is a circuit schematic of an embodiment of a second bias circuit 926 suitable for use with a DQ/DQS receiver. Bias circuit 926 represents one suitable embodiment of a circuit that generates the BIAS5 voltage referred to above. Bias circuit 926 is a replica circuit in that it contains a replica of at least a portion of the circuit to which the BIAS5 voltage is applied. The replica circuit is placed in a feedback loop, and the output of the feedback loop generates a replica bias voltage for the replica circuit. Ultimately, bias circuit 926 strives to duplicate this replica bias voltage as the BIAS5 voltage.

Bias circuit 926 generally includes, without limitation: a reference voltage generator 928; a replica circuit 930; a comparator 932; a variable current source 934; and a current mirror 936. Replica circuit 930 is configured as a replica of one of the two branches of second stage 604 of DQ receiver 600 (or, equivalently, second stage 804 of DQS receiver 800). Replica circuit 930 need not replicate the entire second stage of the DQ/DQS receiver because the second stage is not a differential amplifier stage and, therefore, determining the bias voltage for either identical half of the second stage will be sufficient. Notably, replica circuit 930 need not employ a DDR2/DDR3 mode switching transistor, as used by the second stage of the DQ/DQS receiver (see FIG. 7 and accompanying description). Rather, bias circuit 926 can be suitably controlled and programmed as needed to support either mode. Such control and programming is described in more detail below.

In contrast to second stages 604/804, replica circuit 930 uses a fixed DC voltage at the gate of an input transistor 938. As mentioned previously, this input voltage (labeled $V_{HALF}$) is obtained from bias circuit 900. Accordingly, bias circuit 926 is coupled to bias circuit 900 in this embodiment. For the example described above, where the full swing voltage is VDDIO−0.560 volts, $V_{HALF}$ is equal to VDDIO−0.280 volts. $V_{HALF}$ is used here because the goal is to bias the second stages of the DQ/DQS receivers such that the second stages produce a desired drop of the common mode voltage from input to output. This level shifting characteristic will be influenced by the programmable reference voltage (labeled $V_{PROG5}$ in FIG. 14). In practice, $V_{PROG5}$ represents the desired output level of a second stage when the signal passing through the stage is at its crossing point, i.e., its half-voltage level. This is the reason why $V_{HALF}$ is used in replica circuit 930.

In operation, replica circuit 930 is biased with a voltage (labeled BIAS5_R) that is generated by variable current source 934. In FIG. 14, the voltage at the output node 940 of replica circuit 930 is labeled OUT_REPLICA. In operation, bias circuit 926 strives to bias replica circuit 930 with BIAS5_R such that the voltage of OUT_REPLICA is equal to the output generated by reference voltage generator 928. In FIG. 14, this reference voltage is labeled VDDIO−$V_{PROG5}$. The general configuration, form, and function of reference voltage generator 928 is similar to that of reference voltage generator 902. Accordingly, reference voltage generator 928 will not be redundantly described in detail here. Reference voltage generator 928 is suitably configured to set the reference voltage at node 942 to a particular programmable amount, which can be varied using a BIOS-programmable code to accommodate different PVT conditions. In one exemplary embodiment, a default code value results in a reference voltage of VDDIO−0.850 volts, and that reference voltage is achieved by tuning the adjustable current mirror of reference voltage generator 928 in an appropriate manner. The specific programmability in this embodiment is similar to that of bias circuit 900, wherein the programmable code acts to control the current mirror ratio that determines the reference voltage, given a reference current input from a voltage-to-current element as described for bias circuit 900.

The remainder of bias circuit 926 is similar in configuration, form, and function to that described above for bias circuit 900. Accordingly, the remainder of bias circuit 926 will not be redundantly described in detail here. The feedback loop of bias circuit 926 adjusts OUT_REPLICA until it equals VDDIO−$V_{PROG5}$, within practical tolerances. When the feedback loop reaches steady state, BIAS5_R will cause replica circuit 930 to generate the desired OUT_REPLICA voltage. In turn, an output transistor element 944 generates the desired BIAS5 voltage (which tracks the internal BIAS5_R voltage). As mentioned above in the context of bias circuit 900, a single instantiation of bias circuit 926 may drive multiple instantiations of output transistor element 944, and one instantiation of output transistor element 944 may drive a plurality of DQ receivers and/or a plurality of DQS receivers.

Figure 15:
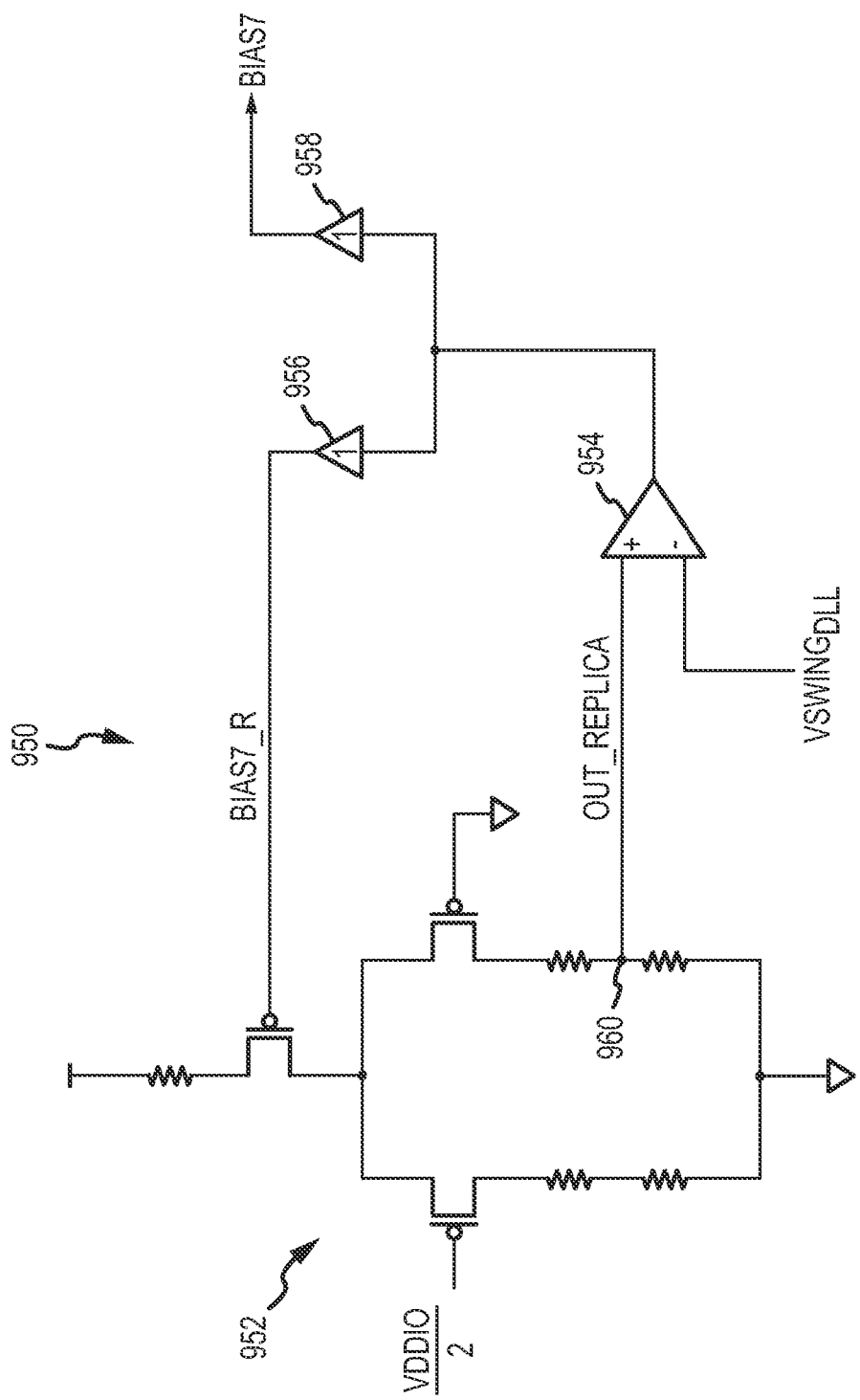
FIG. 15 is a circuit schematic of an embodiment of a third bias circuit suitable for use with a DQS receiver.

FIG. 15 is a circuit schematic of an embodiment of a third bias circuit 950 suitable for use with a DQS receiver. Bias circuit 950 represents one suitable embodiment of a circuit that generates the BIAS7 voltage referred to above. Bias circuit 950 is a replica circuit in that it contains a replica of at least a portion of the circuit to which the BIAS7 voltage is applied. The replica circuit is placed in a feedback loop, and the output of the feedback loop generates a replica bias voltage for the replica circuit. Ultimately, bias circuit 950 strives to duplicate this replica bias voltage as the BIAS7 voltage.

Bias circuit 950 generally includes, without limitation: a replica circuit 952; a comparator 954; and two unity gain buffer amplifiers 956/958. Replica circuit 952 is configured as a replica of third stage 806 of DQS receiver 800. Unlike third stage 806, however, replica circuit 952 uses fixed DC voltages at the gates of its two input transistors. In particular, $$\frac{VDDIO}{2}$$

and 0.0 volts (i.e., ground) are used to force replica circuit 952 into a condition such that the voltage at a node 960 can be monitored and compared by comparator 954. In operation, replica circuit 952 is biased with a voltage (labeled BIAS7_R) that is generated by comparator 954 and unity gain buffer amplifier 956. In FIG. 15, the voltage at the output node 960 of replica circuit 952 is labeled OUT_REPLICA. Buffer amplifiers 956/958 are employed to isolate the drive and stability requirements of comparator 954 from the loads presented by the multiple circuits being driven by BIAS7. In operation, bias circuit 950 strives to bias replica circuit 952 with BIAS7_R such that the voltage of OUT_REPLICA is equal to a desired voltage swing that is dictated by the operating characteristics and preferences of the DLL being driven by to the third stage of the DQS receiver. This desired voltage swing is labeled $VSWING_{DLL}$ in FIG. 15. Thus, bias circuit 950 is suitably configured to generate BIAS7_R in response to the particular operating requirements of the associated DLL. For the embodiment described here, $VSWING_{DLL}$ is about 0.4 volts above VSS.

The feedback loop of bias circuit 950 adjusts OUT_REPLICA until it equals $VSWING_{DLL}$, within practical tolerances. When the feedback loop reaches steady state, BIAS7_R will cause replica circuit 952 to generate the desired OUT_REPLICA voltage. In turn, an output transistor element generates the desired BIAS7 voltage (which tracks the internal BIAS7_R voltage). As mentioned above in the context of bias circuit 900, a single instantiation of bias circuit 950 may drive multiple instantiations of the output transistor element, and one instantiation of the output transistor element may drive a plurality of DQS receivers.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A receiver architecture for a computer processor, the receiver architecture comprising:
a linear receiver portion having a first input node for a data (DQ) signal, a second input node for a reference voltage, and output nodes for a differential output signal, the linear receiver portion being configured to compare the DQ signal to the reference voltage, and to generate the differential output signal in response to the comparison;
a sense amplifier portion coupled to the linear receiver portion, the sense amplifier portion having input nodes connected to the output nodes of the linear receiver portion, and an output node for a binary output signal having voltage characteristics compatible with the computer processor, the sense amplifier portion being configured to transform the differential output signal into the binary output signal; and
a programming architecture coupled to the linear receiver portion, the programming architecture being configured to set operating characteristics of the linear receiver portion;
wherein the linear receiver portion comprises:
a first linear receiver stage configured to receive the DQ signal and the reference voltage, and configured to generate an intermediate differential output signal that swings between an upper supply voltage and a voltage corresponding to the upper supply voltage minus a programmable swing voltage that is set by the programming architecture; and
a second linear receiver stage coupled to the first linear receiver stage, the second linear receiver stage being configured to receive the intermediate differential output signal, and to shift the intermediate differential output signal by a programmable shift voltage that is set by the programming architecture, resulting in the differential output signal.

2. The receiver architecture of claim 1, wherein:
the first linear receiver stage comprises a transistor-based common source cascode linear amplifier with load resistors; and
the first linear receiver stage is biased with a bias voltage generated with the programming architecture, the bias voltage resulting in a voltage drop equal to the programmable swing voltage across the load resistors.

3. The receiver architecture of claim 2, wherein:
the programming architecture is configured to generate a programmable cascode bias voltage; and the first linear receiver stage receives the programmable cascode bias voltage.

4. The receiver architecture of claim 1, wherein the second linear receiver stage comprises:
- a first transistor-based section configured to shift a non-inverted component of the intermediate differential output signal by the programmable shift voltage; and
- a second transistor-based section configured to shift an inverted component of the intermediate differential output signal by the programmable shift voltage.

5. The receiver architecture of claim 1, wherein the second linear receiver stage is biased with a bias voltage generated with the programming architecture, the bias voltage influencing the programmable shift voltage.

6. The receiver architecture of claim 1, wherein the sense amplifier portion comprises:
- a first transistor-based sampling amplifier configured to receive the differential output signal, and configured to generate a first intermediate sampled output signal and a second intermediate sampled output signal in response to the differential output signal; and
- a second transistor-based sampling amplifier coupled to the first transistor-based sampling amplifier, the second transistor-based sampling amplifier being configured to receive the first intermediate sampled output signal and the second intermediate sampled output signal, and configured to generate the binary output signal in response to the first intermediate sampled output signal and the second intermediate sampled output signal.

7. The receiver architecture of claim 1, further comprising a data strobe (DQS) receiver configured to receive a differential DQS input signal for the DQ signal, and configured to generate a differential DQS output signal in response to the differential DQS input signal, wherein clock signals used by the sense amplifier portion are derived from the differential DQS output signal.

8. The receiver architecture of claim 1, wherein the programming architecture comprises a bias circuit architecture coupled to the linear receiver portion, the bias circuit architecture being configured to bias the linear receiver portion such that the differential output signal swings between a specified upper voltage level and a specified lower voltage level.

9. The receiver architecture of claim 8, wherein the bias circuit architecture comprises a replica bias circuit.

10. The receiver architecture of claim 1, wherein the programming architecture is programmable to accommodate various PVT (Process, Voltage, Temperature) conditions.

11. The receiver architecture of claim 1, wherein the programming architecture is programmable to provide overvoltage protection for transistors in the linear receiver portion.

12. A receiver architecture for a computer processor, the receiver architecture comprising:
- a first programmable linear receiver stage configured to receive a single-ended data (DQ) signal and a reference voltage, and to generate a first differential output signal in response to a comparison between the DQ signal and the reference voltage, where the first differential output signal swings between an upper supply voltage and a voltage corresponding to the upper supply voltage minus a programmable swing voltage;
- a second programmable linear receiver stage coupled to the first programmable linear receiver stage, the second programmable linear receiver stage being configured to receive the first differential output signal, and to generate a second differential output signal by shifting the first differential output signal by a programmable shift voltage;
- a first sampling amplifier stage coupled to the second programmable linear receiver stage, the first sampling amplifier stage being configured to receive the second differential output signal, and to generate a first sampled output signal and a second sampled output signal in response to the second differential output signal and in response to a non-inverted clock signal;
- a second sampling amplifier stage coupled to the first sampling amplifier stage, the second sampling amplifier stage being configured to receive the first sampled output signal and the second sampled output signal, and to generate a binary output signal in response to the first sampled output signal, the second sampled output signal, and an inverted clock signal;
- a pulse stretching stage coupled to the second sampling amplifier stage, the pulse stretching stage being configured to transform the binary output signal into a digital output signal that conveys valid data throughout entire cycles of the clock signal, wherein the digital output signal has voltage swing and voltage level characteristics compatible with the computer processor; and
- a programming architecture coupled to the first programmable linear receiver stage and to the second programmable linear receiver stage, the programming architecture being configured to set the programmable swing voltage and the programmable shift voltage.

13. The receiver architecture of claim 12, wherein:
- the first programmable linear receiver stage comprises a transistor-based common source cascode linear amplifier with load resistors; and
- the first programmable linear receiver stage is biased with a programmable bias voltage generated by the programming architecture, the programmable bias voltage resulting in a voltage drop equal to the programmable swing voltage across the load resistors.

14. The receiver architecture of claim 12, wherein the second programmable linear receiver stage is biased with a programmable bias voltage generated by the programming architecture, the programmable bias voltage influencing the programmable shift voltage.

15. A receiver architecture for a computer processor, the receiver architecture comprising:
- a plurality of data (DQ) receivers, each being configured to receive a respective DQ signal and a reference voltage as inputs, and each being configured to transform its DQ signal into a corresponding binary output signal based upon a comparison between the DQ signal and the reference voltage;
- a data strobe (DQS) receiver coupled to each of the DQ receivers, the DQS receiver being configured to receive a shared differential DQS input signal for the DQ receivers, and to generate a differential DQS output signal in response to the differential DQS input signal; and
- a programming architecture coupled to the DQ receivers and to the DQS receiver, the programming architecture being configured to set operating characteristics of the DQ receivers and the DQS receiver; wherein
- clock signals used by the DQ receivers are derived from the differential DQS output signal;
- each of the DQ receivers comprises a programmable linear receiver portion configured to receive its respective DQ signal and the reference voltage, and a clocked sense amplifier portion directly connected to the programmable linear receiver portion; and operation of each programmable linear receiver portion is influenced by the programming architecture such that the binary output signal is generated with voltage swing and voltage level characteristics compatible with the computer processor.

16. The receiver architecture of claim 15, further comprising a delay locked loop coupled to the DQS receiver, the delay locked loop being configured to receive the differential DQS output signal, and to generate therefrom the clock signals used by the DQ receivers.

17. The receiver architecture of claim 15, wherein the programming architecture comprises a bias circuit architecture coupled to each programmable linear receiver portion, the bias circuit architecture being programmable to accommodate various PVT (Process, Voltage, Temperature) conditions.

18. A receiver architecture for a computer processor, the receiver architecture comprising:
   a linear receiver portion having a first input node for a data (DQ) signal, a second input node for a reference voltage, and output nodes for a differential output signal, the linear receiver portion being configured to compare the DQ signal to the reference voltage, and to generate the differential output signal in response to the comparison;
   a sense amplifier portion coupled to the linear receiver portion, the sense amplifier portion having input nodes connected to the output nodes of the linear receiver portion, and an output node for a binary output signal having voltage characteristics compatible with the computer processor, the sense amplifier portion being configured to transform the differential output signal into the binary output signal;
   a programming architecture coupled to the linear receiver portion, the programming architecture being configured to set operating characteristics of the linear receiver portion; and
   a data strobe (DQS) receiver configured to receive a differential DQS input signal for the DQ signal, and configured to generate a differential DQS output signal in response to the differential DQS input signal, wherein clock signals used by the sense amplifier portion are derived from the differential DQS output signal, and wherein the DQS receiver comprises:
      a first linear receiver stage configured to receive the differential DQS input signal, and configured to generate a first intermediate differential DQS output signal that swings between an upper supply voltage and a voltage corresponding to the upper supply voltage minus a swing voltage; and
      a second linear receiver stage coupled to the first linear receiver stage, the second linear receiver stage being configured to receive the first intermediate differential DQS output signal, and to shift the first intermediate differential DQS output signal by a programmable shift voltage, resulting in a second intermediate differential DQS output signal.

19. The receiver architecture of claim 18, the DQS receiver further comprising a third linear receiver stage coupled to the second linear receiver stage, the third linear receiver stage being configured to receive the second intermediate differential DQS output signal, and to generate the differential DQS output signal therefrom, such that the differential DQS output signal swings between a lower supply voltage and a second voltage corresponding to the lower supply voltage plus a second programmable swing voltage.

* * * * *